(12) United States Patent
Yamaguchi

(10) Patent No.: US 8,907,262 B2
(45) Date of Patent: Dec. 9, 2014

(54) SOLID STATE IMAGING DEVICE AND ELECTRONIC APPARATUS HAVING A PHOTOELECTRIC CONVERSION FILM OUTSIDE OF A SEMICONDUCTOR SUBSTRATE AND DUAL CHARGE ACCUMULATION UNIT

(75) Inventor: Tetsuji Yamaguchi, Kanagawa (JP)

(73) Assignee: Sony Corporation (JP)

(*) Notice: Subject to any disclaimer, the term of this patent is extended or adjusted under 35 U.S.C. 154(b) by 260 days.

(21) Appl. No.: 13/456,418

(22) Filed: Apr. 26, 2012

(65) Prior Publication Data

US 2012/0286137 A1  Nov. 15, 2012

(30) Foreign Application Priority Data

May 10, 2011 (JP) ................. 2011-105284

(51) Int. Cl.
*H01L 27/00* (2006.01)
*H01L 27/146* (2006.01)

(52) U.S. Cl.
CPC ...... *H01L 27/1464* (2013.01); *H01L 27/14607* (2013.01); *H01L 27/14623* (2013.01); *H01L 27/14689* (2013.01)
USPC ...................... 250/208.1; 250/239

(58) Field of Classification Search
USPC .............. 250/208.1, 214 R, 214.1, 239; 348/294–311; 257/290–294, 440–443
See application file for complete search history.

(56) References Cited

U.S. PATENT DOCUMENTS 8,564,036 B2 * 10/2013 Warashina et al. ........... 257/293

FOREIGN PATENT DOCUMENTS

JP  2006-278446  10/2006

* cited by examiner

*Primary Examiner* — Que T Le
(74) *Attorney, Agent, or Firm* — Sheridan Ross P.C.

(57) ABSTRACT

A solid-state imaging device which includes, a photoelectric conversion film provided on a second surface side which is the opposite side to a first surface on which a wiring layer of a semiconductor substrate is formed, performs photoelectric conversion with respect to light in a predetermined wavelength region, and transmits light in other wavelength regions; and a photoelectric conversion layer which is provided in the semiconductor substrate, and performs the photoelectric conversion with respect to light in other wavelength regions which has transmitted the photoelectric conversion film, in which input light is incident from the second surface side with respect to the photoelectric conversion film and the photoelectric conversion layer.

20 Claims, 19 Drawing Sheets

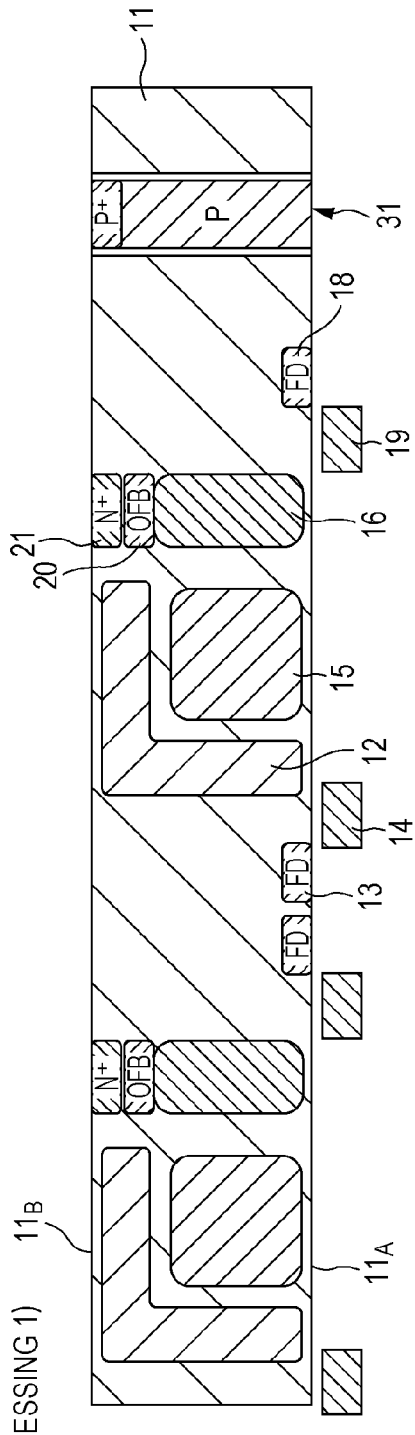
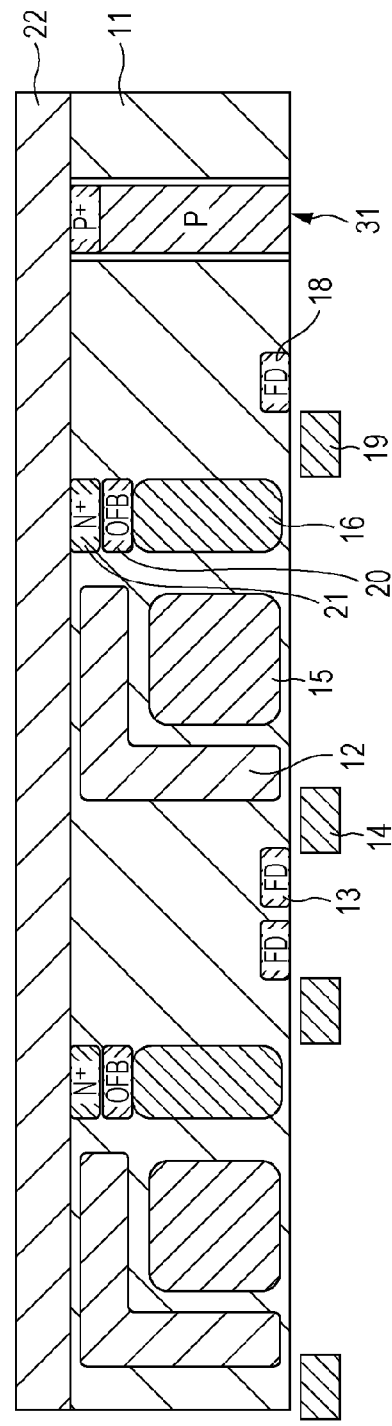

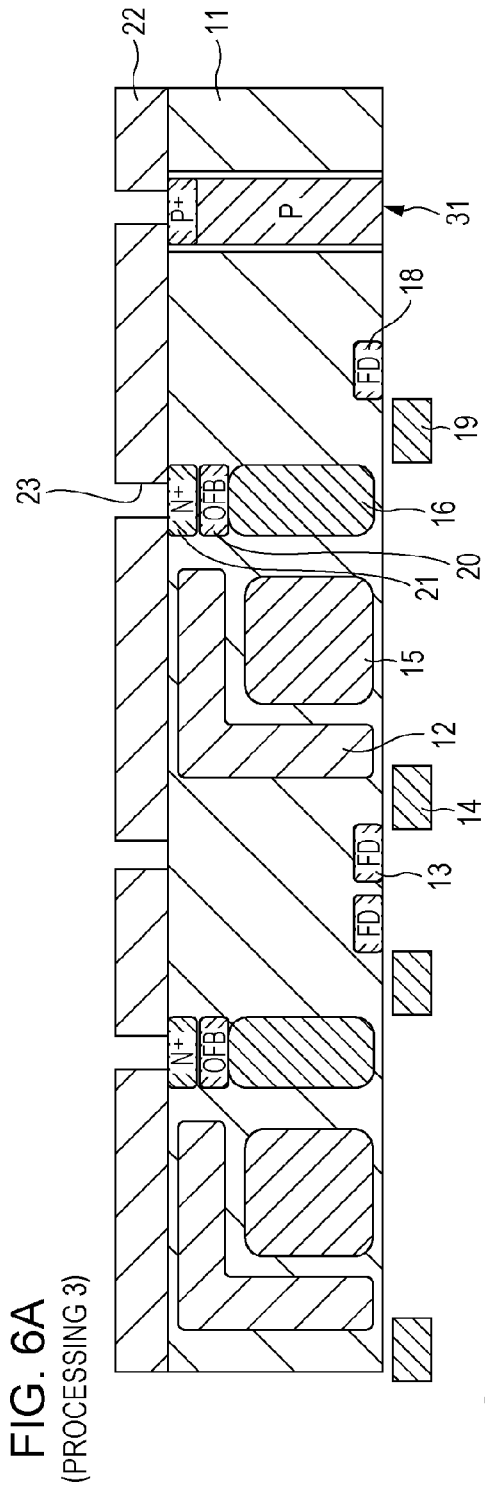
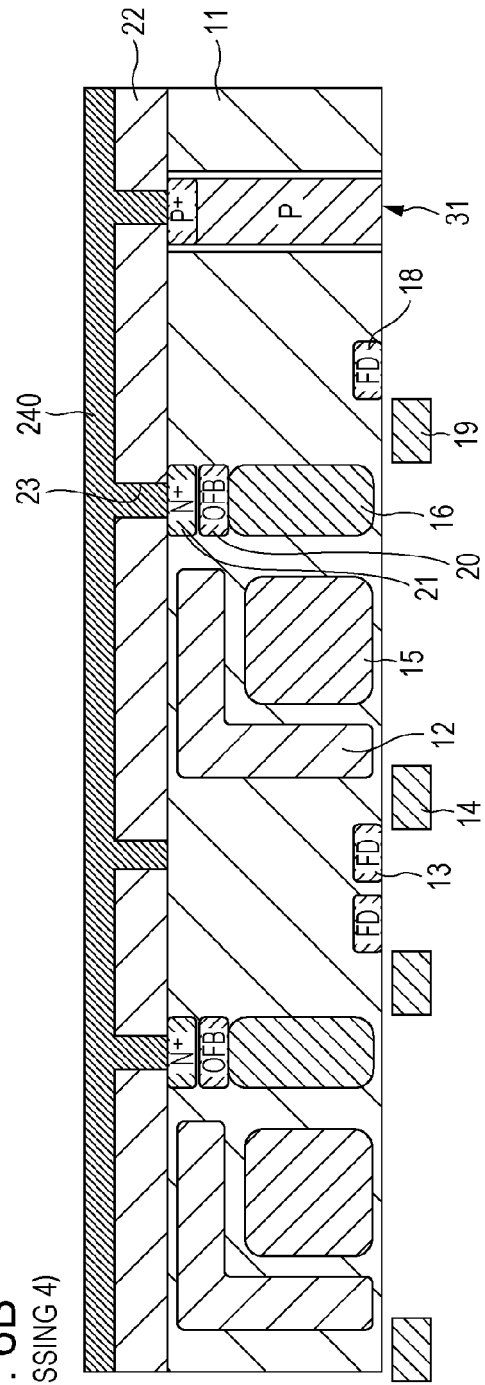
FIG. 6A (PROCESSING 3)
FIG. 6B (PROCESSING 4)

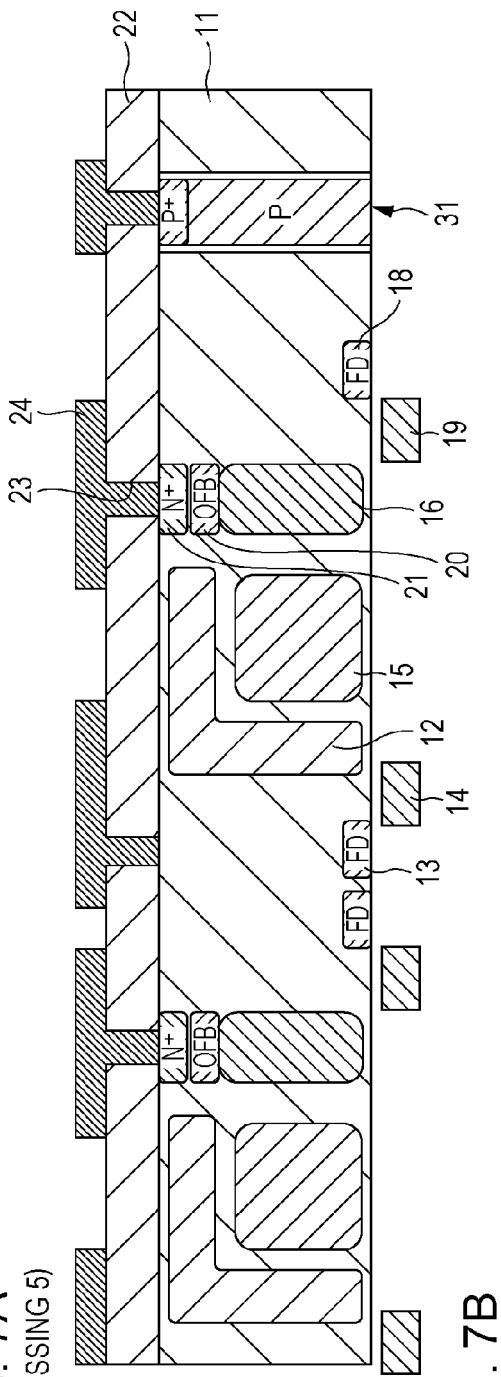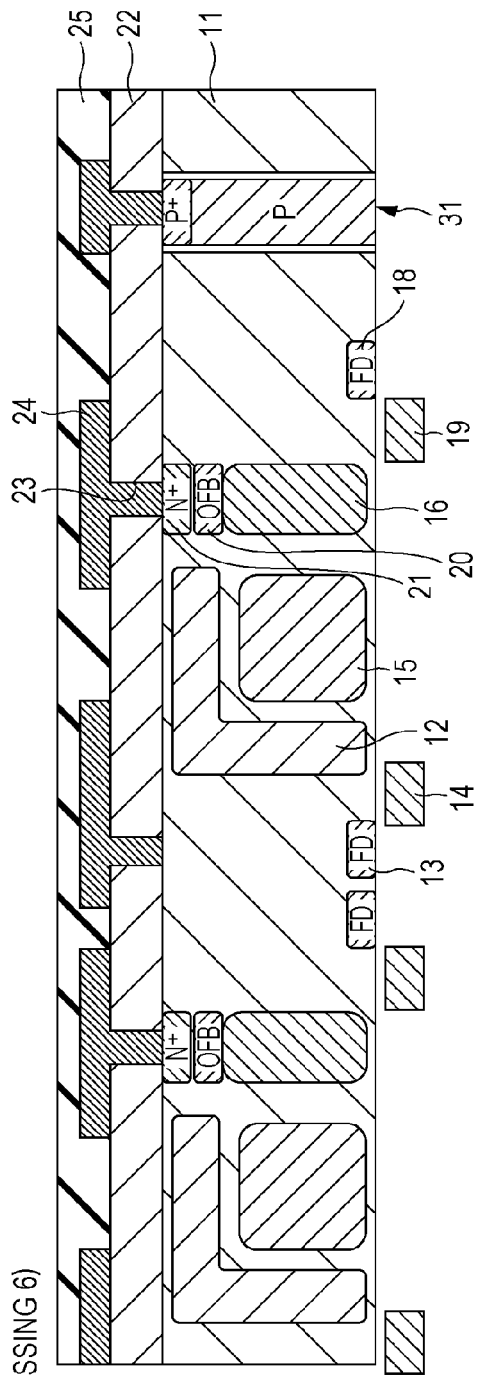

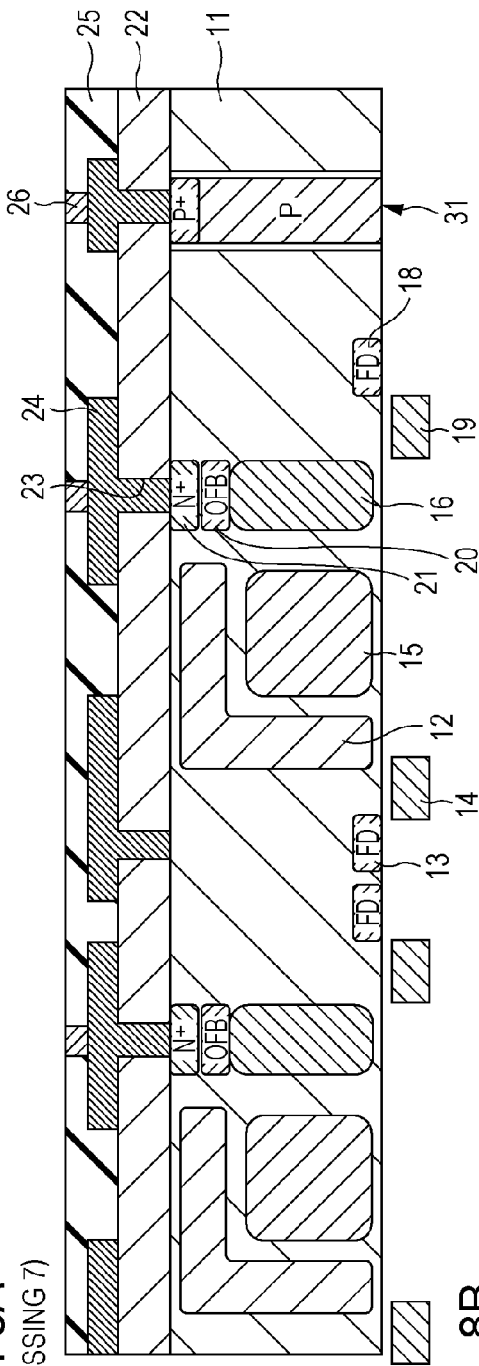
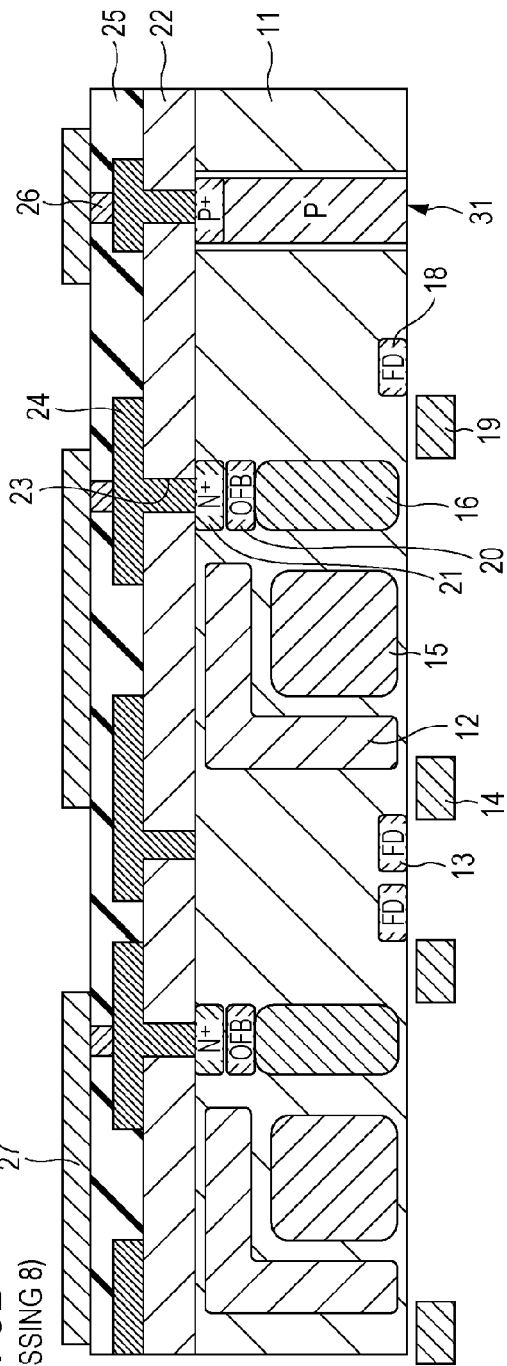
FIG. 8A (PROCESSING 7)
FIG. 8B (PROCESSING 8)

(PROCESSING 9)

(PROCESSING 10)

(PROCESSING 11)

SOLID STATE IMAGING DEVICE AND ELECTRONIC APPARATUS HAVING A PHOTOELECTRIC CONVERSION FILM OUTSIDE OF A SEMICONDUCTOR SUBSTRATE AND DUAL CHARGE ACCUMULATION UNIT

BACKGROUND

The present disclosure relates to a solid-state imaging device and an electronic apparatus, particularly, to an electronic apparatus which performs photoelectric conversion to input light using a photoelectric conversion film, and an electronic apparatus having the solid-state imaging device.

As the solid-state imaging device, a device is in general use in which, for example, pixels (sub-pixels) corresponding to three primary colors of R (red), G (green), and B (blue) are arranged planarly on the semiconductor substrate, light beams of the three primary colors are photoelectrically converted, respectively in each pixel, and the charge obtained by the photoelectric conversion is read out. As the pixel array of colors, the Bayer array in which one red pixel and one blue pixel are present with respect to two green pixels is representatively exemplified.

In this type of solid-state imaging device, there is a problem in that color separation occurs, since the light beams of the three primary colors RGB are detected in different plane positions from each other, and a false color occurs due to the difference in light receiving position. The false color causes a deterioration of image quality. In order to avoid this problem, a solid-state imaging device having a so-called lamination type pixel structure in the related art, in which G light photoelectric conversion film is provided outside the semiconductor substrate, and photoelectric conversion layers for B light and R light are provided inside the semiconductor substrate has been proposed (for example, refer to Japanese Unexamined Patent Application Publication No. 2006-278446).

SUMMARY

The solid-state imaging device having the lamination type pixel structure in Japanese Unexamined Patent Application Publication No. 2006-278446 adopts a front surface side illumination pixel structure in which input light is radiated from the front surface side of the semiconductor substrate with respect to the pixel, when a surface on a side where a wiring layer of the semiconductor substrate is formed is set to the front surface. In a case of the front side illumination pixel structure, since a wiring layer is present between the substrate surface and a photoelectric conversion film which is arranged thereon, there is a distance between the photoelectric conversion layer provided inside the semiconductor substrate and the photoelectric conversion film provided outside the semiconductor substrate.

Here, a case where light is obliquely input to the pixel is assumed. Since the G light photoelectric conversion film is present in the vicinity of the input face, the input light can be photoelectrically converted regardless of the angle of light which is input obliquely. On the other hand, since the photoelectric conversion layers for B light and R light which are provided inside the semiconductor substrate are present at a position separated from the G light photoelectric conversion film, the larger the inclination angle, the more difficult it is for input light to reach the photoelectric conversion layer. That is, a change in sensitivity with respect to F value is different depending on the arrangement position of the photoelectric conversion film and the photoelectric conversion layer. Due to this, F value dependency in sensitivity occurs in each color.

Therefore, in the present disclosure, it is desirable to provide a solid-state imaging device which is able to reduce an F value dependency for the sensitivity of each color when adopting a lamination type pixel structure, and an electronic apparatus including the solid-state imaging device.

According to an embodiment of the present disclosure, there is provided a solid-state imaging device which includes, a photoelectric conversion film which is provided on a second surface side which is opposite to a first surface on which a wiring layer of the semiconductor substrate is formed, which performs photoelectrical conversion with respect to light with a predetermined wavelength region, and transmits light with another wavelength region; and a photoelectric conversion layer which is provided inside the semiconductor substrate, and performs photoelectrical conversion with respect to the light in another wavelength region which has transmitted the photoelectric conversion film, in which the solid-state imaging device has a configuration in which input light is incident from the second surface side with respect to the photoelectric conversion film and the photoelectric conversion layer. The solid-state imaging device is used as an imaging unit (image reading unit) of a variety of electronic apparatuses.

According to the embodiment of the present disclosure, in the solid-state imaging device, or the electronic apparatus which has the solid-state imaging device as the imaging unit, in a case where input light is incident from a second surface side when a first surface on which a wiring layer of the semiconductor substrate is formed is set to a substrate surface, it is a so-called backside illumination pixel structure in which the input light is radiated from a rear surface side with respect to the photoelectric conversion film and the photoelectric conversion layer.

The backside illumination pixel structure is a structure in which the wiring layer is not present between the semiconductor substrate and the photoelectric conversion film, accordingly, it is possible to make the distance between the photoelectric conversion film and the substrate surface, and the distance between the photoelectric conversion film and the photoelectric conversion layer in the substrate, compared to a structure in which the wiring layer is present, that is, a so-called front side illumination pixel structure. Due to this, it is possible to reduce a change in sensitivity with respect to the F value which is caused by a difference in arrangement position of the photoelectric conversion film and the photoelectric conversion layer in the optical axis direction of the input light.

According to the present disclosure, it is possible to reduce the F value dependency for the sensitivity of each color, since the change in sensitivity with respect to the F value which is caused by a difference in arrangement position of the photoelectric conversion film and the photoelectric conversion layer in the optical axis direction of the input light can be reduced.

BRIEF DESCRIPTION OF THE DRAWINGS

FIGS. 5A and 5B are process diagrams (first thereof) which describe manufacturing processes of the pixel structure according to the first example.

FIGS. 6A and 6B are process diagrams (second thereof) which describe manufacturing processes of the pixel structure according to the first example.

FIGS. 7A and 7B are process diagrams (third thereof) which describe manufacturing processes of the pixel structure according to the first example.

FIGS. 8A and 8B are process diagrams (fourth thereof) which describe manufacturing processes of the pixel structure according to the first example.

DETAILED DESCRIPTION OF EMBODIMENTS

Figure 1:
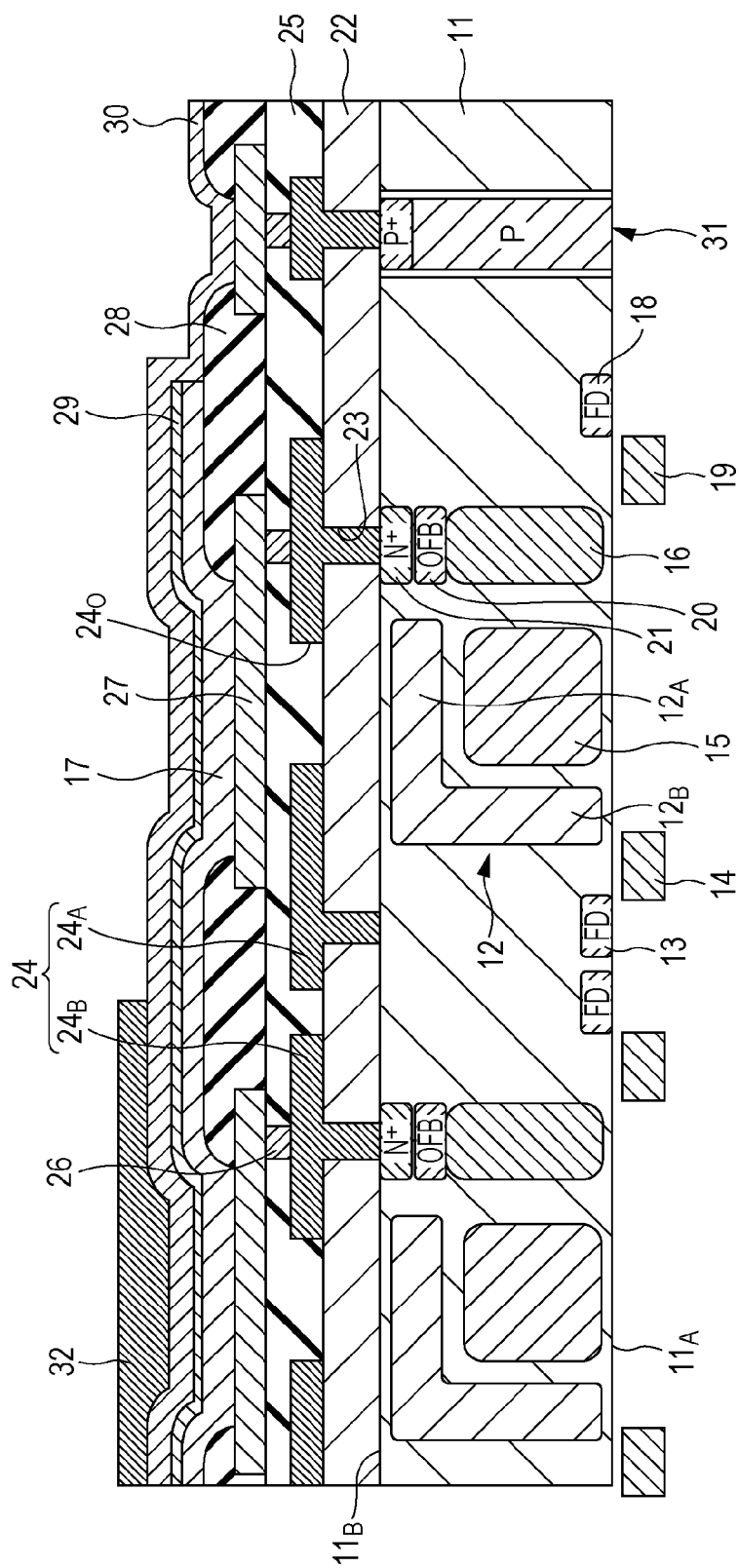
FIG. 1 is a cross-sectional view which shows a pixel structure according to a first example of a solid-state imaging device according to the present disclosure.

Hereinafter, embodiments for performing a technology of the present disclosure (hereinafter, referred to as "embodiment") will be described in detail with reference to drawings. In addition, the description will be made in the following order.

1. Description of embodiments
1-1. First example
1-2. Second example
1-3. Third example
1-4. Fourth example
2. Modification example
3. Electronic apparatus (Imaging device)
4. Configuration of the present disclosure 1. Description of Embodiments The solid-state imaging device according to embodiments of the present disclosure adopts a lamination-type pixel structure in which a photoelectric conversion film which performs photoelectrical conversion with respect to light in a predetermined wavelength region, and transmits light in another wavelength region is provided outside a semiconductor substrate, and a photoelectric conversion layer which performs the photoelectrical conversion with respect to light which has transmitted the photoelectric conversion film, and is in another wavelength region is provided inside the semiconductor substrate.

In this lamination-type pixel structure, the photoelectric conversion film which is provided outside the semiconductor substrate absorbs light in a predetermined wavelength region which is included in input light, for example, G (green) light, and performs photoelectrical conversion with respect to the G light. On the other hand, the photoelectric conversion layer which is provided inside the semiconductor substrate is formed of, for example, two photoelectric conversion layers which are vertically provided in the optical axis direction of the input light. Specifically, one of the two photoelectric conversion layers is located at a position on the surface layer side of the semiconductor substrate, and the other photoelectric conversion layer is located at the lower part of the one photoelectric conversion layer.

In addition, the photoelectric conversion layer which is located at the position on the surface layer side of the semiconductor substrate between the two photoelectric conversion layers absorbs light other than G light which has transmitted the photoelectric conversion film, in the light in the wavelength range, for example, B (blue) light, and performs the photoelectric conversion with respect to the B light. In addition, the photoelectric conversion layer which is located at the lower part of the photoelectric conversion layer on the surface layer side absorbs light which has transmitted the photoelectric conversion layer on the surface layer side, for example, R (red) light, and performs the photoelectric conversion with respect to the R light.

Here, when the first surface on which a wiring layer of the semiconductor substrate is formed is set to the front surface of the substrate, the G light photoelectric conversion film is provided on the second surface side, that is, the rear surface side of the substrate. In addition, as a structure in which the input light is radiated (incident) to the G light photoelectric conversion film, a backside illumination pixel structure in which the input light is radiated from the rear surface side is adopted.

In this manner, in the lamination-type pixel structure in which the backside illumination is adopted, since the wiring layer is not present between the semiconductor substrate and the G light photoelectric conversion film, it is possible to make the distance short between the photoelectric conversion film and the substrate surface, and between the photoelectric conversion film and the photoelectric conversion layer inside the substrate compared to the pixel structure of the front side illumination on which the wiring layer is present. Due to this, it is possible to reduce the F value dependency for the sensitivity of each color, since the change in sensitivity with respect to the F value which is caused by a difference in arrangement position of the photoelectric conversion film and the photoelectric conversion layer in the optical axis direction of the input light can be reduced.

In addition, since only single color information is obtained from each pixel (sub pixel) in the solid-state imaging device of, for example, a Bayer array, insufficient color information is complemented by collecting and supplying color information from peripheral pixels thereof with respect to each pixel, by performing signal processing which is referred to as demosaicing. However, when performing such signal processing, as described above, a deterioration of image quality which is referred to as a false color is caused accompanying the signal processing. Such a problem can be settled by adopting the above described lamination-type pixel structure.

Hereinafter, a detailed example of the solid-state imaging device according to the embodiment of the present disclosure will be described as the first to fourth examples. Hereinafter, a pixel structure of a unit pixel (one pixel unit) including the photoelectric conversion film and the photoelectric conversion layer as features of the embodiment will be mainly described.

1-1. First Example

First, a configuration of a pixel structure and a manufacturing process according to a first example of a solid-state imaging device according to the embodiment of the present disclosure will be described.

Configuration of Pixel Structure

FIG. 1 is a cross-sectional view of a pixel structure according to the first example of the solid-state imaging device according to the embodiment of the present disclosure.

In FIG. 1, the semiconductor substrate, for example, a silicon substrate 11 sets a lower surface $11_A$ to the front surface (first surface), and an upper surface $11_B$ on the opposite side thereof to the rear surface (second surface). A wiring layer is formed on the front surface $11_A$ side of the silicon substrate 11. Here, for simplifying the drawing, the wiring layer is not shown in the drawing.

For example, B (blue) light photoelectric conversion layer 12 is provided in the surface layer of the rear surface $11_B$ side inside the silicon substrate 11. The B light photoelectric conversion layer 12 is formed such that, for example, the cross-section thereof has an inverted L shape, performs photoelectric conversion with respect to the B light included in the input light, and accumulates charges generated due to the photoelectric conversion.

Specifically, in the inverted L shape photoelectric conversion layer 12, a portion parallel to the substrate surface becomes the photoelectric conversion unit $12_A$, and a portion which is vertical to the substrate surface becomes the photoelectric conversion unit $12_B$. A floating diffusion unit 13 (hereinafter, described to as "FD unit") is provided in the vicinity of the B light photoelectric conversion layer 12, and the charge in the photoelectric conversion layer 12 is transferred to the FD unit 13 by a control of a transfer gate 14 which is formed in the wiring layer.

For example, an R (red) light photoelectric conversion layer 15 is provided on the lower part of the B light photoelectric conversion layer 12. The R light photoelectric conversion layer 15 performs the photoelectric conversion with respect to the R light which is included in the input light, and accumulates charges which are generated due to the photoelectric conversion. Here, the FD unit is provided in the vicinity of the R light photoelectric conversion layer 15, as well, though it is omitted in the drawing, and the charge in the photoelectric conversion layer 15 is transferred to the FD unit by a control of the transfer gate which is formed in the wiring layer.

For example, a G (green) light charge accumulation unit 16 is provided next to the photoelectric conversion layers 12 and 15. The charge accumulation unit 16 is provided outside the silicon substrate 11, and accumulates the charge obtained due to the photoelectric conversion by a G light photoelectric conversion film 17, which is described later. An FD unit 19 is provided in the vicinity of the charge accumulation unit 16, and charges in the charge accumulation unit 16 are transferred to the FD unit 19 by a control of a transfer gate 20 which is formed in the wiring layer.

In addition, an overflow barrier (OFB) 20 for washing out charges which overflow from the charge accumulation unit 16 is provided on the charge accumulation unit 16. In addition, a contact unit 21 is formed between the overflow barrier 20 and the substrate surface, for example, by an $N^+$ diffusion region. The charge which is obtained due to the photoelectric conversion by the G light photoelectric conversion film 17 is transferred to the charge accumulation unit 16 through the N+ contact unit 21 and the overflow barrier 20.

The above described B light photoelectric conversion layer 12, R light photoelectric conversion layer 15, the G light charge accumulation unit 16, and constituent elements which are incorporated thereto is provided as unit pixels.

An anti-reflection film 22 is formed on the rear surface of the silicon substrate 11 over the entire substrate surface. A contact hole 23 is formed in a state of being reached the substrate surface of the silicon substrate 11 on the anti-reflection film 22. In addition, light shielding films 24 ($24_A$ and $24_B$) which define a region where light is input to the silicon substrate 11 are formed on the anti-reflection film 22. The light shielding films 24 mainly have a function of shielding the G light charge accumulation unit 16, however, also function as a wiring, by being formed of conductive materials.

As the light shielding film 24, it is preferable to use a laminated film of titanium (Ti) as barrier metal and titanium nitride (TiN) and tungsten (W), since it is necessary to make contact with the silicon substrate 11. The light shielding film 24 forms a contact unit (corresponds to contact units 33 and 34 in FIGS. 2 and 3) which makes electrical contact with the silicon substrate 11 by being embedded in the contact hole 23.

The light shielding film 24 is necessary to passes the input light with respect to the B light photoelectric conversion layer 12 and the R light photoelectric conversion layer 15. Accordingly, an opening $24_O$ is formed at the upper part of the photoelectric conversion layers 12 and 15 of the light shielding film 24. The light shielding film 24 defines a region where light in input to the silicon substrate 11 by the opening $24_O$.

An insulating film 25 is formed on the light shielding film 24, and further, a contact plug 26 is formed in pixel units through the insulating film 25. The contact plug 26 makes electrical contact with respect to the light shielding film 24 which is located at the upper part of the G light charge accumulation unit 16. The top face of the insulating film 25 is planarized by the CMP (Chemical Mechanical Polishing), or the like.

One electrode 27 (hereinafter, described as a "lower electrode") which is transparent is formed in pixel units on the insulating film 25. The lower electrode 27 is formed in a state of being in electrical contact with respect to the contact plug 26. An insulating film 28 for mitigating the level difference of the edges of the lower electrode 27 is formed at the periphery of the lower electrode 27. It is possible to form the insulating film 28 by performing etching so as to expose the front surface of the lower electrode 27 with a taper shape, after forming the insulating film across the entire surface.

The above described G light photoelectric conversion film 17 which absorbs the G light, and performs the photoelectric conversion is formed on the lower electrode 27 and the insulating film 28. The G light photoelectric conversion film 17 has an area which is larger than the area (opening area) of the opening $24_O$ of the light shielding film 24. Further, a transparent electrode (hereinafter, described as an "upper electrode") 29 as a part of the upper electrode is formed common to all pixels, and over the entire pixel array unit (pixel region)

which is formed by the pixels which are arranged in a matrix, on the photoelectric conversion film 17. Further, a transparent electrode 30 is formed on the upper electrode 29. The transparent electrode 30 is electrically connected (comes into contact with) to a power supply unit 31 in the silicon substrate 11 at the peripheral region of the pixel array unit. In addition, a light shielding film 32 is formed on the pixels in an optical black region where the photoelectric conversion is not performed.

The pixel structure of the above configuration has the lamination-type pixel structure in which the G light photoelectric conversion film 17 is located outside the silicon substrate 11, and the B light photoelectric conversion unit 12 and the R light photoelectric conversion layer 15 are laminated inside the silicon substrate 11. In addition, the lamination-type pixel structure adopts a backside illumination pixel structure in which input light is radiated (incident) from the rear surface $11_B$ side of the silicon substrate 11.

In the lamination-type backside illumination pixel structure, a predetermined bias voltage is supplied to the transparent electrode 30 through a part of the light shielding film 24 as the wiring from the power supply unit 31 of the silicon substrate 11, and the bias voltage is supplied to the upper electrode 29 through the transparent electrode 30. When light is input to the G light photoelectric conversion film 17 through the transparent electrode 30 and the transparent upper electrode 29, in a state where the bias voltage is applied to the upper electrode 29, the photoelectric conversion film 17 absorbs the G light, and performs the photoelectric conversion thereto.

The charge obtained due to the photoelectric conversion by the G light photoelectric conversion film 17 is taken out by the transparent lower electrode 27, is transferred to the G light charge accumulation unit 16 through the contact plug 26, the light shielding film 24 ($24_A$) as the wiring, and further the contact unit 34 (refer to FIGS. 2 and 3), and is accumulated. The charge accumulated to the charge accumulation unit 16 is selectively transferred to an FD unit 18 by a control of the transfer gate 19.

On the other hand, the light which has transmitted the G light photoelectric conversion film 17 is input to the silicon substrate 11 through the opening $24_O$ of the light shielding film 24. Subsequently, in a portion which is parallel to the substrate surface, that is, in the photoelectric conversion unit $12_A$, the B light photoelectric conversion layer 12 absorbs the B light, and performs the photoelectric conversion with respect to the B light, in the light in the wavelength region other than G light, transfers the charge obtained by the photoelectric conversion to a portion which is perpendicular to the substrate surface, that is, the photoelectric conversion unit $12_B$, and accumulates the charge in the photoelectric conversion unit $12_B$. The charge accumulated in the B light charge accumulation unit $12_A$ is selectively transferred to the FD unit 13 by a control of the transfer gate 14.

In addition, the light which has transmitted the B light photoelectric conversion layer 12 is input to the R light photoelectric conversion layer 15. The R light photoelectric conversion layer 15 absorbs the R light, and performs the photoelectric conversion with respect to the R light, and accumulates the R light, in the light which has transmitted the B light photoelectric conversion layer 12. Similarly to the charge with respect to the G light and R light, the charge which is accumulated in the R light photoelectric conversion layer 15 is also selectively transferred to the FD unit by a control of the transfer gate.

Figure 2:
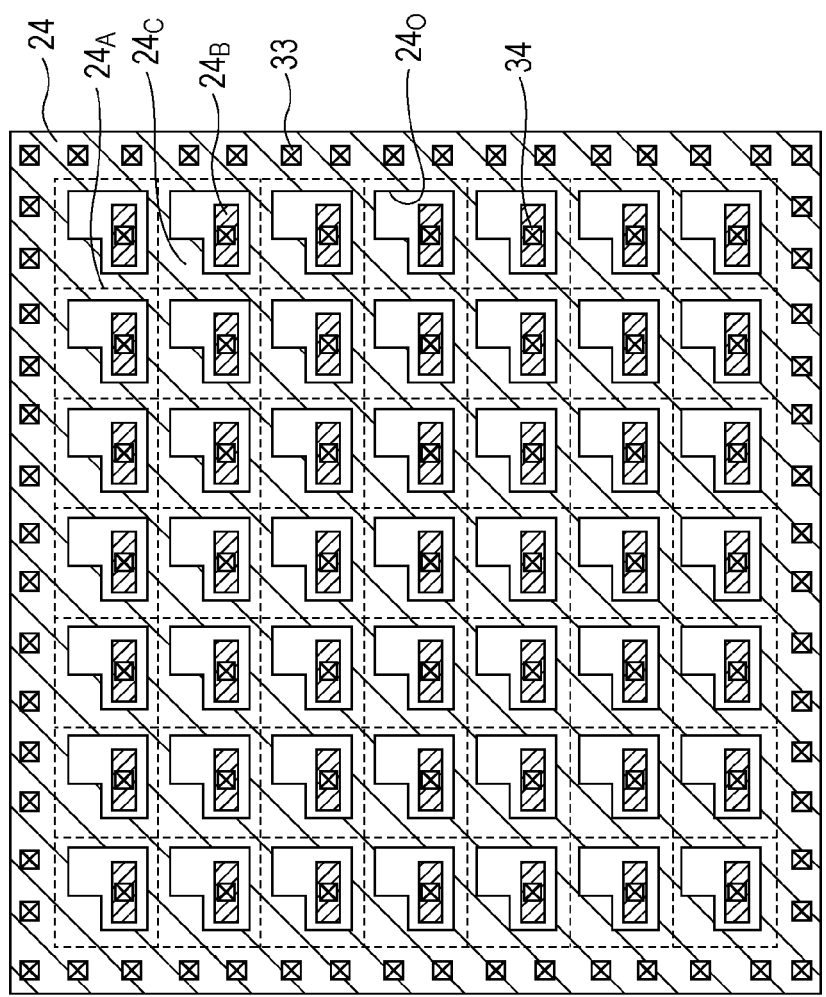
FIG. 2 is a top view which shows a state where a light shielding film of a pixel array unit in the pixel structure according to the first example.
Figure 3:
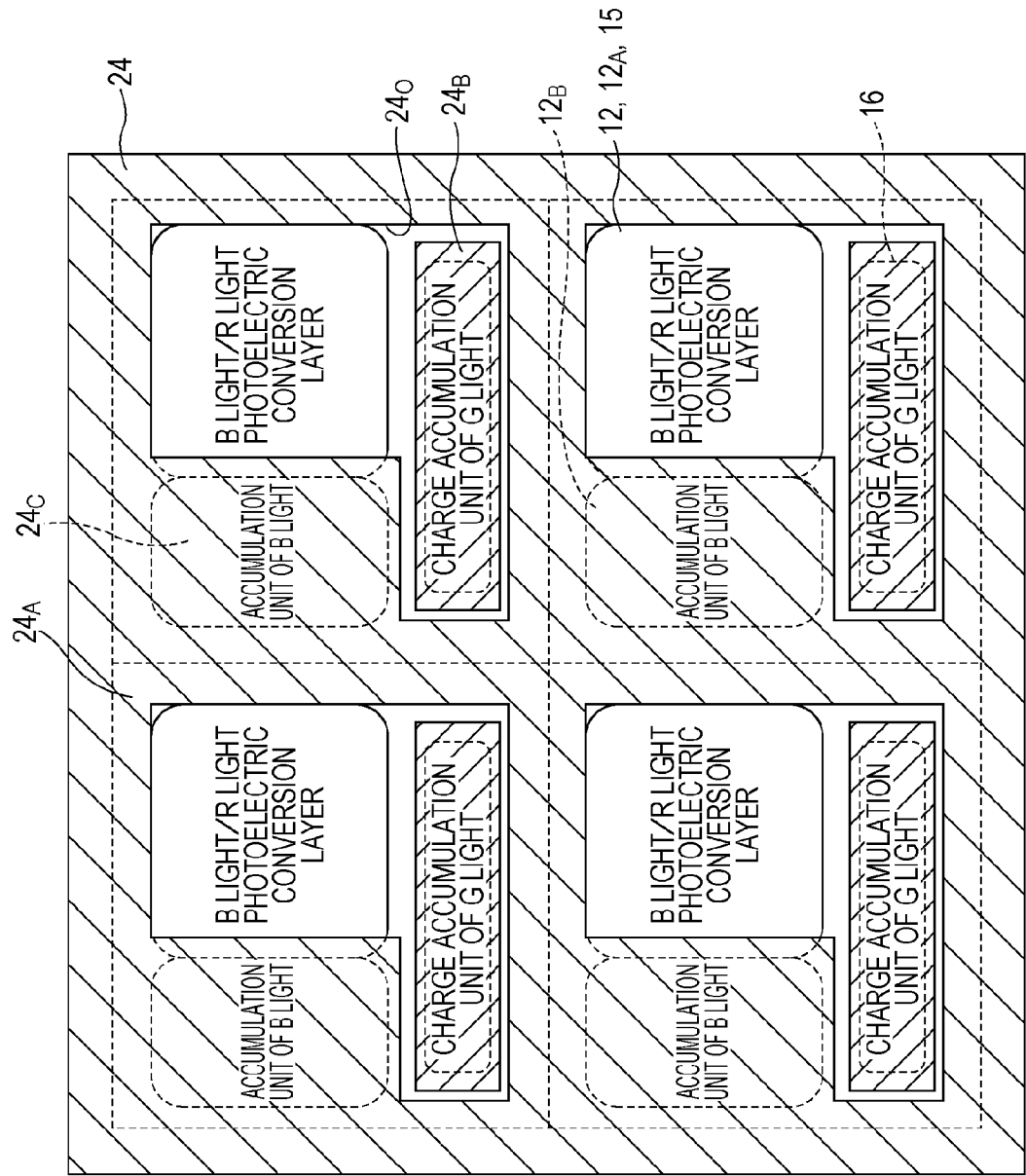
FIG. 3 is an enlarged view of four pixels in FIG. 2 which are adjacent to each other vertically, and horizontally.

FIG. 2 is a top view in a state where the light shielding films 24 ($24_A$ and $24_B$) of the pixel array unit in which the pixels are arranged in a matrix is formed. In addition, FIG. 3 enlarges four pixels in FIG. 2 which are adjacent to each other vertically and horizontally. In FIGS. 2 and 3, the light shielding films 24 ($24_A$ and $24_B$) are shown by being hatched in order to facilitate understanding.

As shown in FIGS. 2 and 3, the light shielding film 24 is configured by the light shielding film $24_A$ which is formed in a lattice shape between pixels, and shields the pixels from each other, and the light shielding film $24_B$ which is formed in an island shape in the pixels, and shields the G light charge accumulation unit 16 of each pixel. The light shielding film $24_A$ which shields the pixels from each other is formed in each pixel row and pixel column between pixels in the pixel array unit, and is set to a predetermined potential, for example, a well potential (ground potential/0 V), by coming into contact with the silicon substrate 11 through the contact unit 33 at the peripheral portion of the pixel array unit. That is, the light shielding film $24_A$ becomes equipotential in the entire region of the pixel array unit.

The light shielding film $24_A$ not only performs shielding between pixels, but also performs shielding with respect to the charge accumulation unit (a portion perpendicular to the substrate surface) $12_B$ of the photoelectric conversion layer 12. Specifically, the light shielding film $24_A$ has a light shielding film $24_C$ which is formed to be overhung to one corner portion of rectangular pixel in each of pixels, and in the light shielding film $24_C$, the photoelectric conversion unit $12_B$ of the photoelectric conversion layer 12 is shielded.

On the other hand, the light shielding film $24_B$ has an area which is larger than that of the upper part of the G light charge accumulation unit 16, and shields the G light charge accumulation unit 16 which is formed in an island shape in the rectangular pixel. In addition, the light shielding film $24_B$ functions as a wiring which transfers the charge which is taken out by the lower electrode 27 to the G light charge accumulation unit 16 by being in contact with the silicon substrate 11 by the contact unit 34 of which a wiring material is embedded in the contact hole 23 (refer to FIG. 1).

In this manner, the charge of the light shielding film $24_B$ which shields the G light charge accumulation unit 16 is determined for each pixel. In contrast to this, as described above, the light shielding film $24_A$ becomes equipotential, for example, the ground potential in the entire region of the pixel array unit. That is, the light shielding film $24_A$ which performing shielding between pixels and the light shielding film $24_B$ which shields the G light charge accumulation unit 16 for each pixel have different potentials from each other.

Figure 4:
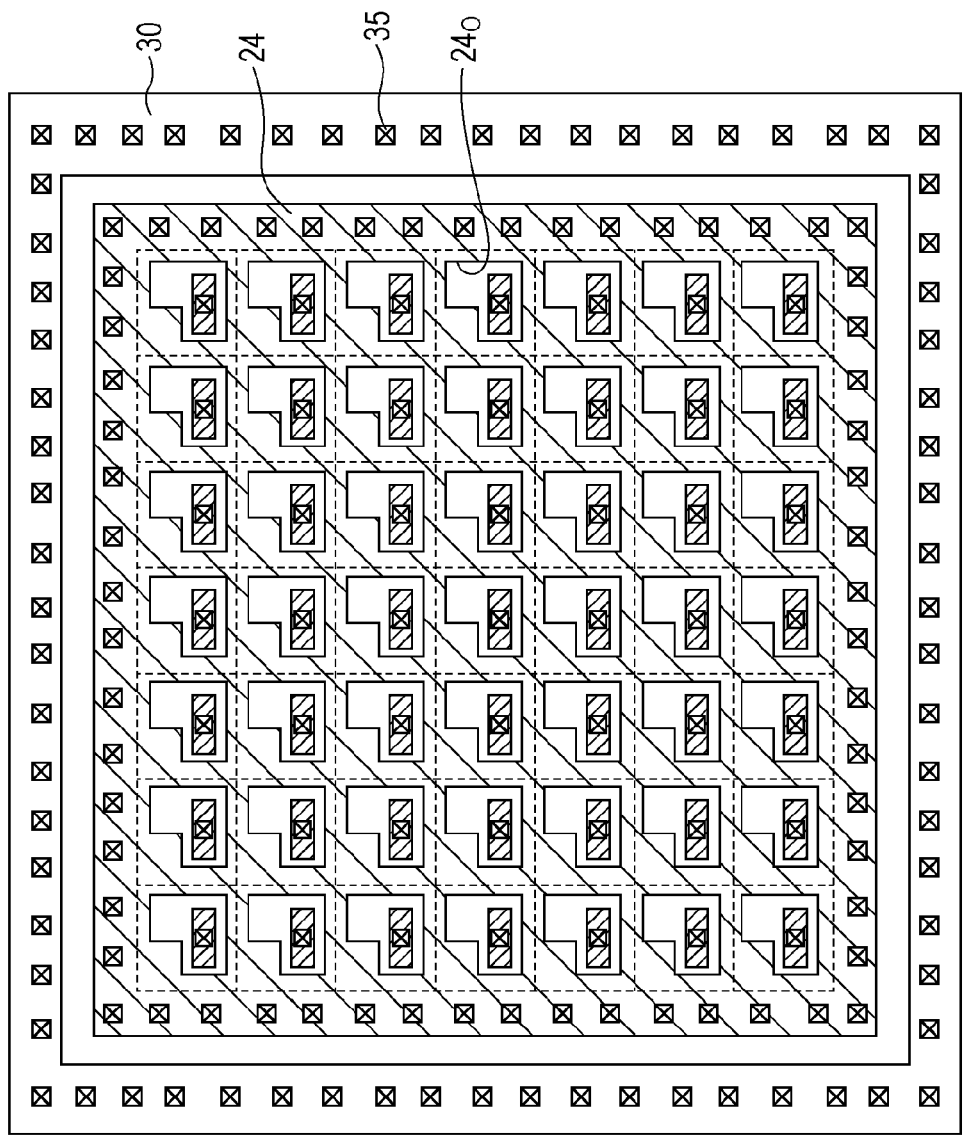
FIG. 4 is a plan view which shows a state where transparent electrodes are added to the upper electrode in a laminating manner in the pixel structure according to the first example.

FIG. 4 shows a state where the transparent electrode 30 is added to the upper electrode 29 in laminating manner. As shown in the figure, the transparent electrode 30 which is added to the upper electrode 29 in laminating manner is electrically connected to the silicon substrate 11 in the contact unit 35, in the peripheral portion of the pixel array unit, in order to make the potential same in the entire pixel with respect to the upper electrode 29.

In this manner, as shown in FIG. 1, the upper electrode 29 has the same bias potential in the entire pixel, since a predetermined bias voltage is supplied to the upper electrode 29 through the contact unit 35 and transparent electrode 30 from the power supply unit 31. Accordingly, it is possible to perform the photoelectric conversion by the G light photoelectric conversion film 17 under the same conditions in the entire pixel.

Manufacturing Process

Subsequently, the manufacturing process of the pixel structure according to the first example of the above configuration will be described using FIGS. 4 to 9. In addition, in FIGS. 5 to 11, the same portions as those of FIG. 1 are provided with the same reference numerals. Further, similarly to the case in FIG. 1, the transfer gate of R light is not shown in the figure.

As shown in FIG. 5A, the B light and R light photoelectric conversion layers 12 and 15 are laminated in the silicon substrate 11, and the G light charge accumulation unit 16, the overflow barrier 20, and the N$^+$ contact unit 21 are formed, in a state where the silicon substrate 11 in which the wiring layer or the like is formed on the front surface $11_A$ side is turned inside out (first process).

Subsequently, as shown in FIG. 5B, an anti-reflection film 22 is formed on the rear surface (substrate surface) of the silicon substrate 11 (second process), and then, as shown in FIG. 6A, the contact hole 23 is formed in the anti-reflection film 22 (third process). Here, the distance between the light shielding film 24 and the substrate surface of the silicon substrate 11 is determined by the film thickness of the anti-reflection film 22. In addition, it is preferable to make the film thickness of the anti-reflection film 22 as thin as possible, in order to effectively suppress the light obliquely input, since the light shielding film 24 is formed in a state of being adjacent to the substrate surface of the silicon substrate 11.

Subsequently, as shown in FIG. 6B, a conductive film 240 as the light shielding film 24 which also serves as the wiring is formed on the anti-reflection film 22, and the conductive film 240 is embedded in the contact hole 23 (fourth process). It is preferable to use a laminated film of titanium (Ti) as barrier metal and titanium nitride (TiN) and tungsten (W) for the conductive film 240, since it is necessary to make contact with the silicon substrate 11.

Subsequently, as shown in FIG. 7A, conductive film 240, that is, Ti, TiN, and W are processed so as to remain only in the portion for which shielding is desired (fifth process). Here, it is possible to form the plug and the light shielding film 24 without increasing the number of processes, by remaining the material of the contact plug as is as the light shielding film 24.

Subsequently, as shown in FIG. 7B, the insulating film 25 is formed on the shielding film 24, and the top face of the insulating film 25 is planarized using, for example, CMP (Chemical Mechanical Polishing) (sixth processing). In addition, as shown in FIG. 8A, the contact plug 26 is formed on the light shielding film 24 (seventh processing), and then, as shown in FIG. 8B, a transparent electrode as the lower electrode 27 of the G light photoelectric conversion film 17 is formed (eighth processing).

Figure 9:
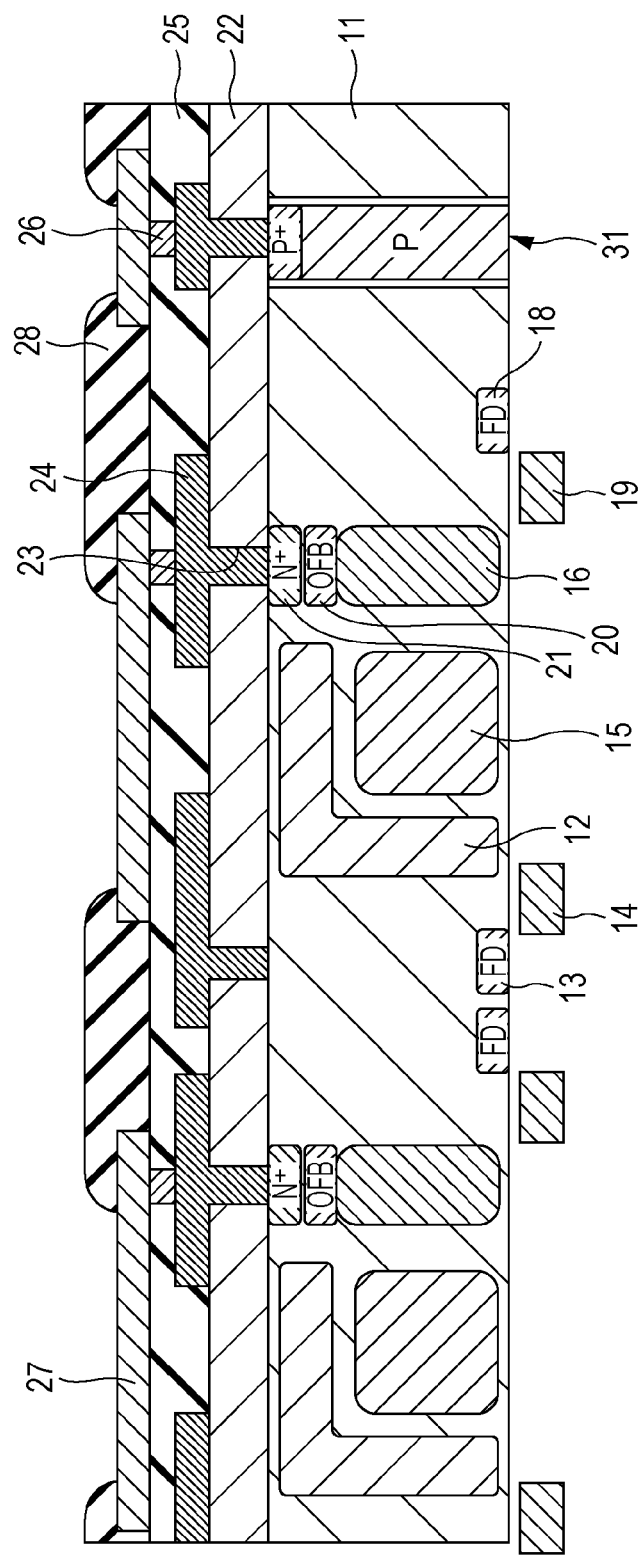
FIG. 9 is a process diagram (fifth thereof) which describes a manufacturing process of the pixel structure according to the first example.

Subsequently, as shown in FIG. 9, the insulating film 28 for mitigating the level difference of the edges of the lower electrode 27 is formed (ninth processing). It is possible to form the insulating film 28 by performing etching so as to expose the front surface of the lower electrode 27 with a taper shape, after entirely forming the insulating film.

Figure 10:
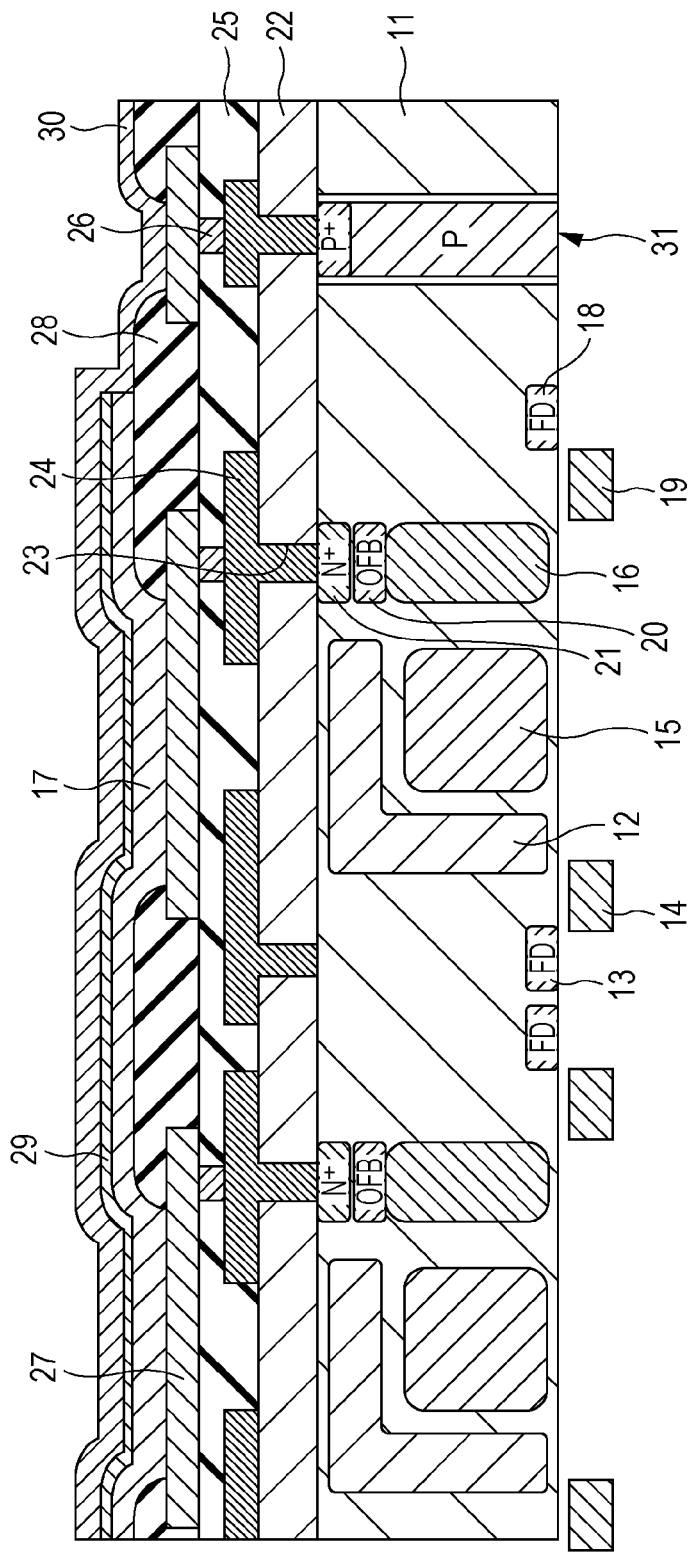
FIG. 10 is a process diagram (sixth thereof) which describes a manufacturing process of the pixel structure according to the first example.
Figure 11:
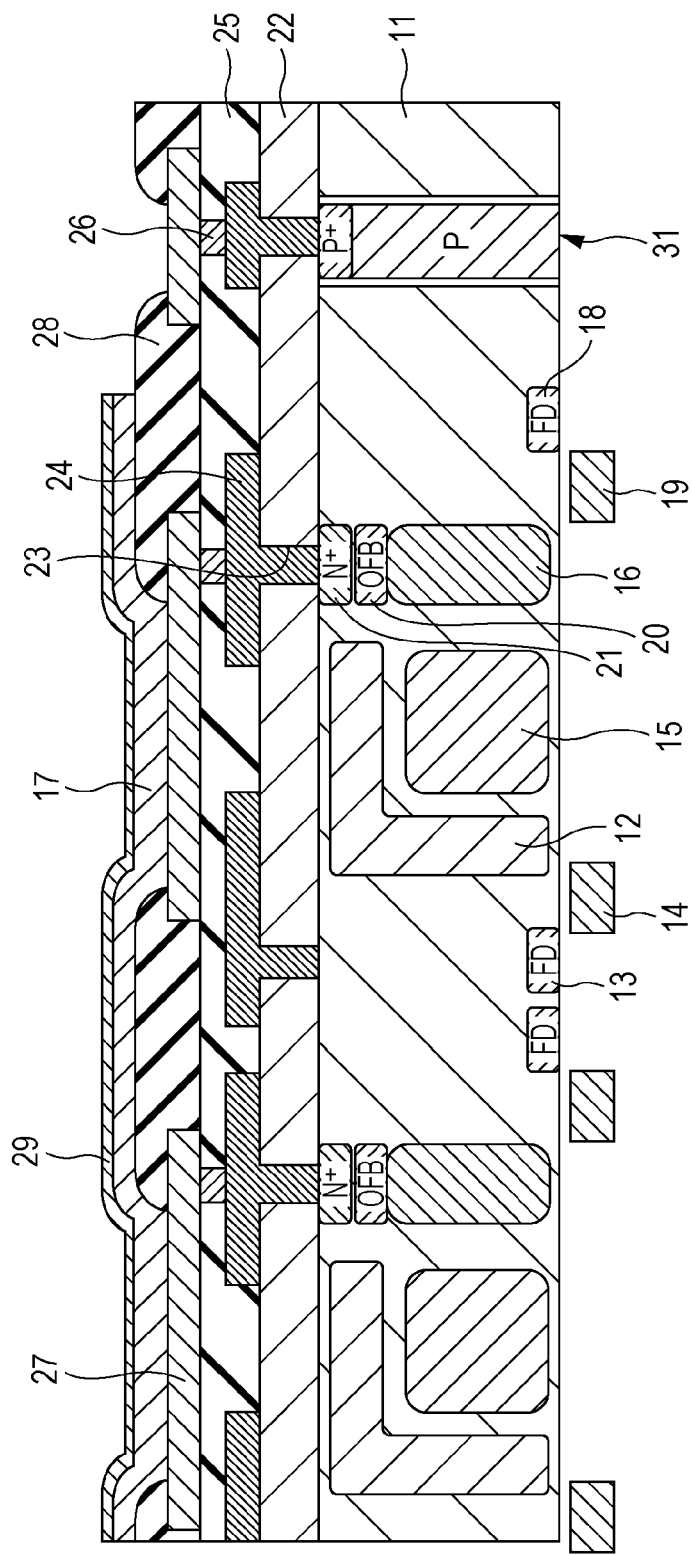
FIG. 11 is a process diagram (seventh thereof) which describes a manufacturing process of the pixel structure according to the first example.

Subsequently, as shown in FIG. 10, the G light photoelectric conversion film 17 and the transparent electrode as a part of the upper electrode 29 are sequentially formed (tenth processing). Here, after forming the G light photoelectric conversion film 17 and the transparent electrode as a part of the upper electrode 29, the photoelectric conversion film 17 is processed so as to be the desired shape having the upper electrode 29 as a hard mask. Thereafter, as shown in FIG. 11, the transparent electrode 30 is further added by being laminated (eleventh processing). In addition, as shown in FIG. 1, finally, the light shielding film 32 is formed on the pixel in the optical black region in which the photoelectric conversion is not performed.

As described above, the pixel structure according to the first example adopts the backside illumination pixel structure. According to the backside illumination pixel structure, since the wiring layer is not present between the silicon substrate 11 and the G light photoelectric conversion film 17, it is possible to make the distance short between the photoelectric conversion film 17 and the substrate surface, and between the photoelectric conversion film 17 and the photoelectric conversion layers 12 and 15 inside the substrate compared to the pixel structure of the front side illumination in which the wiring layer is present. Due to this, it is possible to reduce the F value dependency for the sensitivity of each color, since the change in sensitivity with respect to the F value which is caused by a difference in arrangement position of the G light photoelectric conversion film 17 and the B light and R light photoelectric conversion layers 12 and 15 in the optical axis direction of the input light can be reduced.

Here, when the B light and R light photoelectric conversion layers 12 and 15 are provided in the silicon substrate 11, it is necessary to open the light receiving surface of the silicon substrate 11, that is, the upper portions of the photoelectric conversion layers 12 and 15. In addition, similarly, it is necessary to shield the G light charge accumulation unit 16 which is provided in the silicon substrate 11, and it is desired to reliably suppress the leakage of light which is input obliquely with respect to the light shielding film 24.

In contrast to this, in the pixel structure according to the first example, it has a structure in which the shielding is performed at a position adjacent to the substrate surface, since only the anti-reflection film 22 is present between the light shielding films 24 ($24_A$, $24_B$, and $24_C$) and the silicon substrate 11. Accordingly, it is possible to reliably suppress the leakage of light which is input obliquely by the light shielding film 24, even though the opening $24_o$ is present in the light shielding film 24. In addition, it is possible to further reliably suppress the leakage of oblique light, since the light shielding film 24 also functions as the wiring, and the contact portion which electrically connects the G light photoelectric conversion film 17 and the silicon substrate 11 to each other, that is, a convex portion which protrudes to the substrate side of the light shielding film 24 also forms a part of the light shielding structure of the G light photoelectric conversion film 17.

In addition, even in the two photoelectric conversion layers 12 and 15 which are provided in the silicon substrate 11, it is necessary to perform shielding between pixels which are adjacent to each other in order to suppress the color mixing between adjacent pixels. Even for this, in the pixel structure according to the first example, the light shielding film $24_A$ which shields the adjacent pixels is formed in the same process, and as the same layer as the light shielding film $24_B$ which shields the G light charge accumulation unit 16, accordingly, it is possible to perform desired shielding without increasing the number of processes. Due to this, it is possible to exert an effect of reducing the color mixing between pixels.

In addition, further, it is necessary to apply a predetermined bias voltage to the upper electrode 29 in order to perform the photoelectric conversion in the photoelectric conversion film 17 which is formed by being pinched by the lower electrode 27 and the upper electrode 29. In contrast to this, in the pixel structure according to the first example, since the light shielding film 24 is used as a part of the wiring for applying the predetermined bias voltage to the upper electrode 29, it is possible to suppress an increase in the number of processes compared to a case of forming a separate wiring.

1-2. Second Example

A pixel structure according to a second example has the same pixel structure according to the first example, basically, in the structure and the flow of processing, however, a configuration of a light shielding film 24 and the way of taking a potential are different from the pixel structure according to the first example. That is, in the cross-section structure of the pixel structure according to the second example, the structure is basically the same as the pixel structure according to the first example shown in FIG. 1 excluding the configuration of the light shielding film 24.

Figure 12:
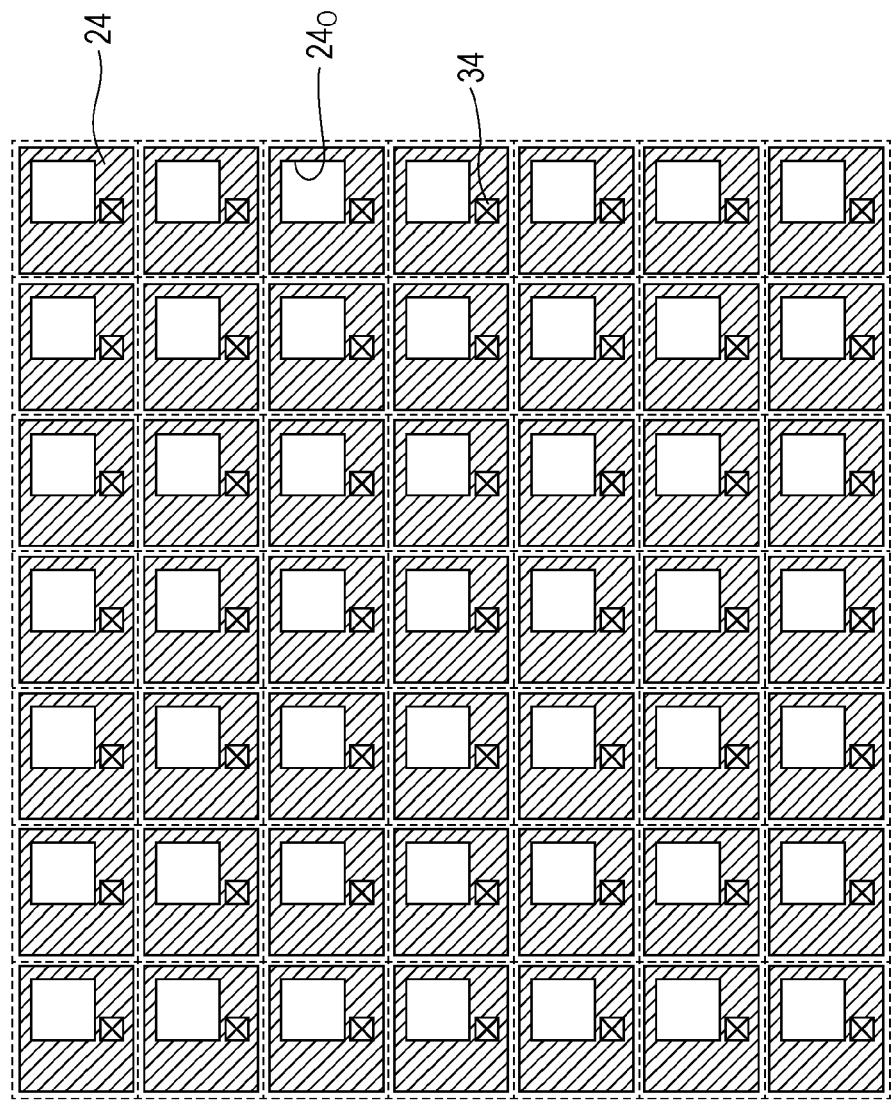
FIG. 12 is a top view which shows a state where a light shielding film of a pixel array unit is formed in a pixel structure according to a second example.
Figure 13:
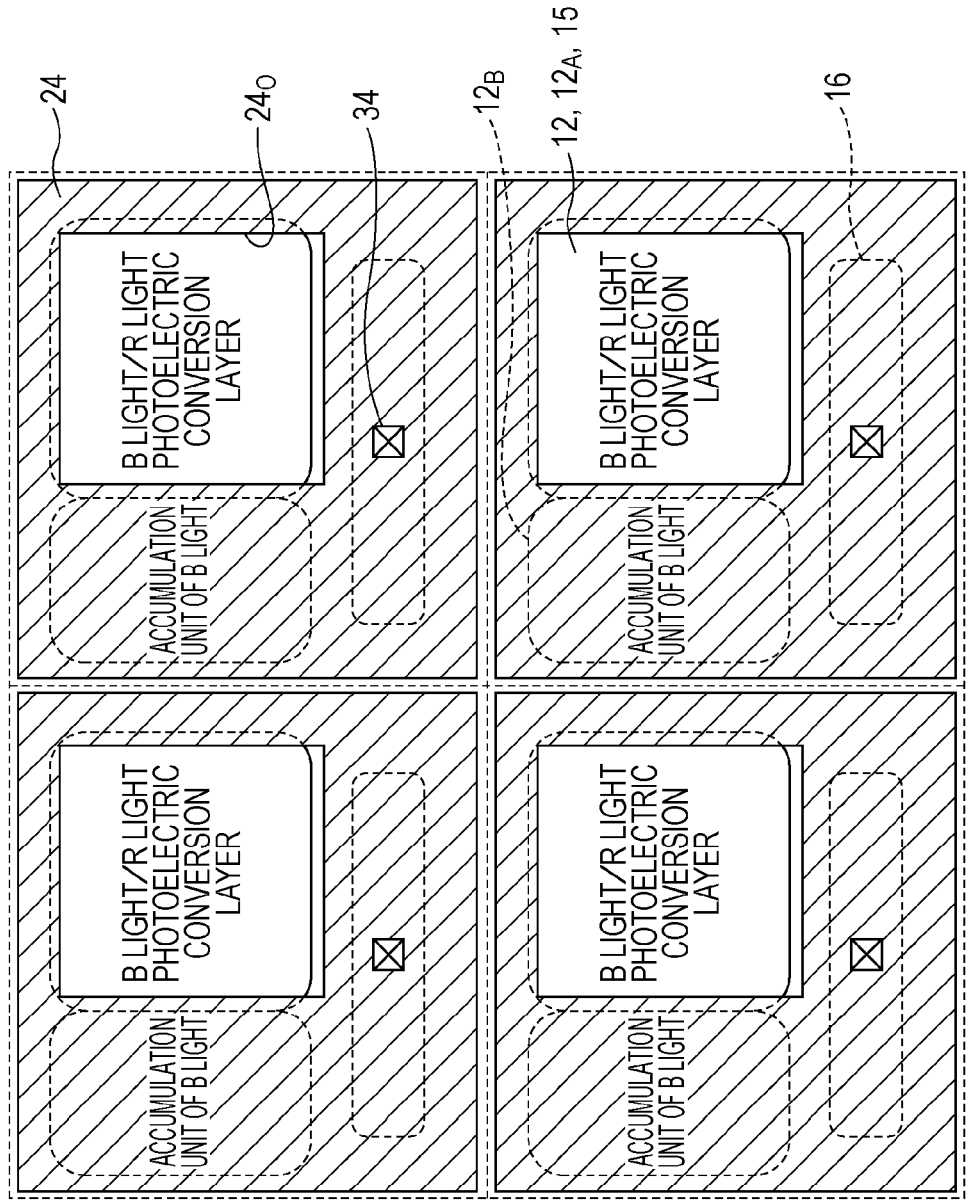
FIG. 13 is an enlarged view of four pixels in FIG. 12 which are adjacent to each other vertically, and horizontally.

FIG. 12 is a top view in a state where the light shielding film 24 of a pixel array unit in the pixel structure according to the second example of the solid-state imaging device according to the embodiment of the present disclosure is formed. In addition, FIG. 13 enlarges four pixels in FIG. 12 which are adjacent to each other vertically and horizontally. In FIGS. 12 and 13, the light shielding film 24 is shown by being hatched in order to facilitate understanding.

In the pixel structure according to the first example has a configuration in which the entire peripheral portion of the pixel is shielded by the light shielding film 24 ($24_A$ and $24_C$), and a G light charge accumulation unit 16 is shielded by the light shielding film $24_B$ which is electrically separated from the light shielding film 24. In addition, the light shielding film 24 comes into contact with, for example, a ground potential in a contact unit 33 in the periphery of a pixel array unit, and the light shielding film $24_B$ functions as a wiring, as well, by coming into contact with a silicon substrate 11 in a contact unit 34.

In contrast to this, as shown in FIGS. 12 and 13, the pixel structure according to the second example has a configuration in which the light shielding film $24_B$ which shields the G light charge accumulation unit 16 as the light shielding film 24, and a light shielding film $24_C$ which shields the photoelectric conversion unit $12_B$ of the B light photoelectric conversion layer 12 are integrally formed. As a matter of course, an opening $24_o$ which passes input light is formed at the upper portion of the photoelectric conversion unit $12_A$ of the B light photoelectric conversion layer 12, in the light shielding film 24.

In addition, the light shielding films 24 ($24_B$ and $24_C$) also function as wirings which supply a charge which is taken out from a photoelectric conversion film 17 through a lower electrode 27 to the G light charge accumulation unit 16, by coming into contact with the silicon substrate 11 in the contact unit 34. The light shielding films 24 ($24_B$ and $24_C$) have structures which are separated from each other in each pixel, since they are forming a part of the wiring.

Figure 14:
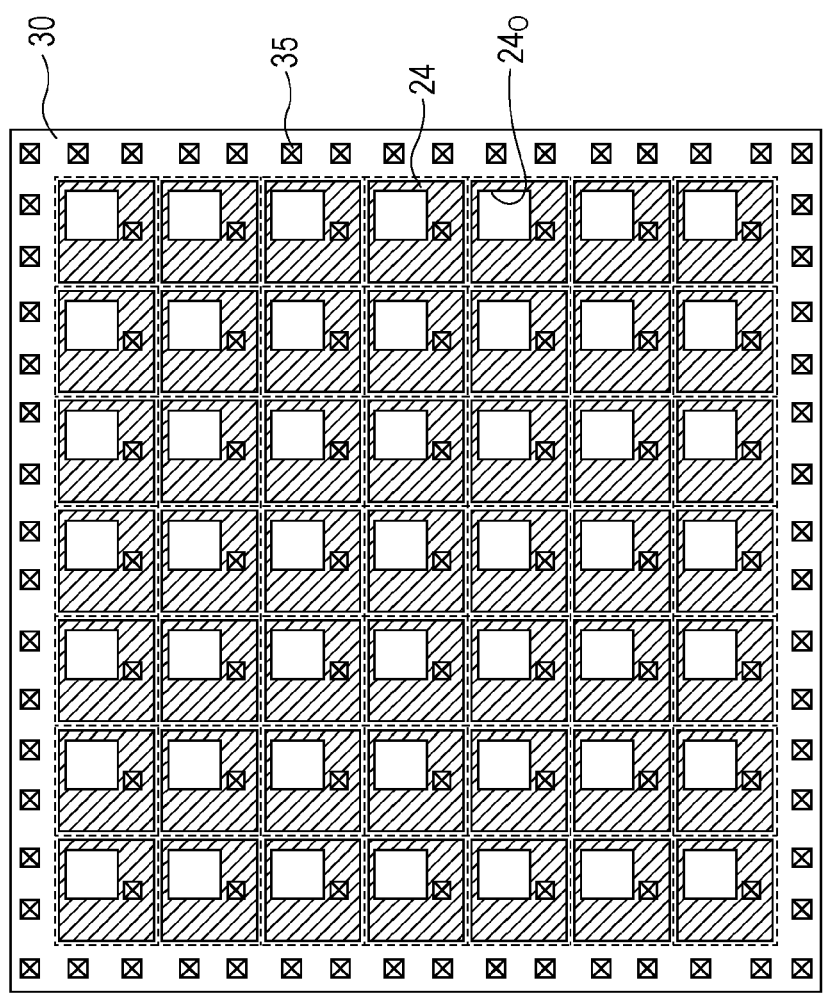
FIG. 14 is a plan view which shows a state where transparent electrodes are added in a laminating manner on upper electrodes in the pixel structure according to the second example.

FIG. 14 shows a state where a transparent electrode 30 is added to an upper electrode 29 by being laminated. As shown in the figure, the transparent electrode 30 which is added to the upper electrode 29 by being laminated is electrically connected to the silicon substrate 11 in the contact unit 35 at the peripheral portion of the pixel array unit, in order to have the same potential in the entire pixel with respect to the upper electrode 29.

According to the pixel structure in the second example, the light shielding film $24_C$ which shields the photoelectric conversion unit $12_B$ of the B light photoelectric conversion layer 12 and the light shielding film $24_B$ which shields the G light charge accumulation unit 16 are integrally formed, it is possible to eliminate light leakage from the upper portion between the photoelectric conversion unit $12_B$ and the charge accumulation unit 16. In addition, since the contact portion which corresponds to the contact portion 33 in FIG. 2 is not necessary, it is possible to reduce the chip size by the number of contact portions decreased.

1-3. Third Example

A pixel structure according to a third example is basically the same as the pixel structure in the first example regarding the structure and the process, however, a configuration of a light shielding film 24 and the way of taking a potential are different from the pixel structure according to the first example. That is, in the cross-section structure of the pixel structure according to the third example, the structure is basically the same as the pixel structure according to the first example shown in FIG. 1, excluding the configuration of the light shielding film 24.

Figure 15:
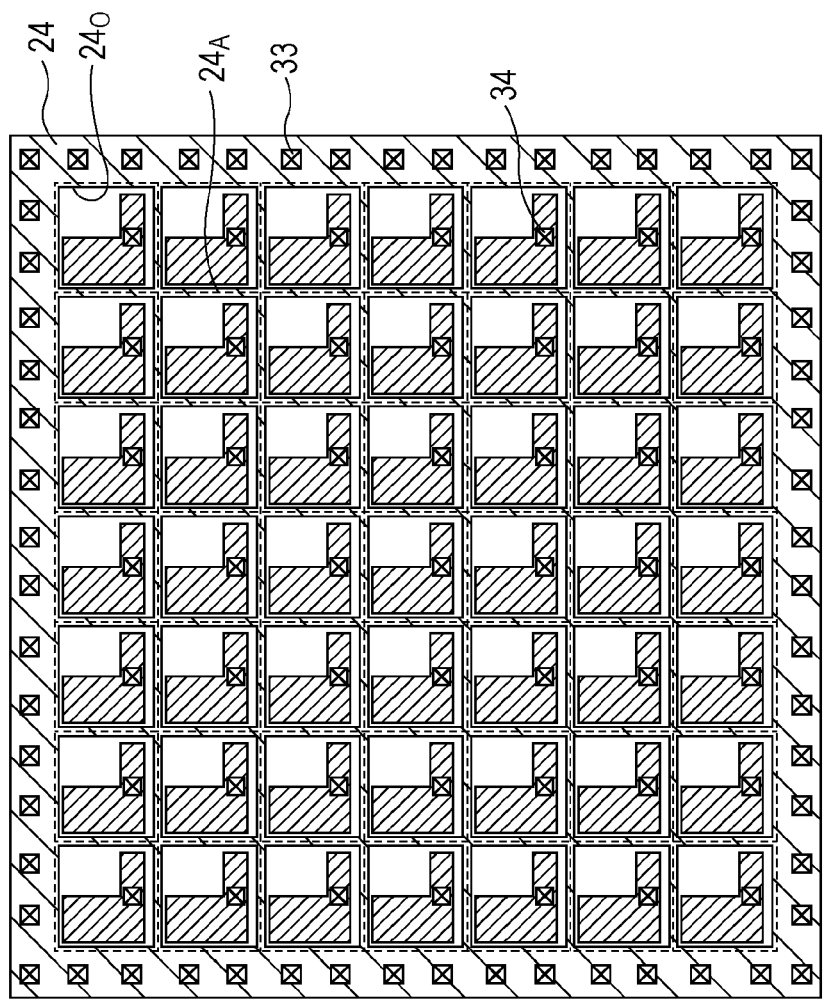
FIG. 15 is a top view which shows a state where a light shielding film of a pixel array unit is formed in a pixel structure according to a third example.
Figure 16:
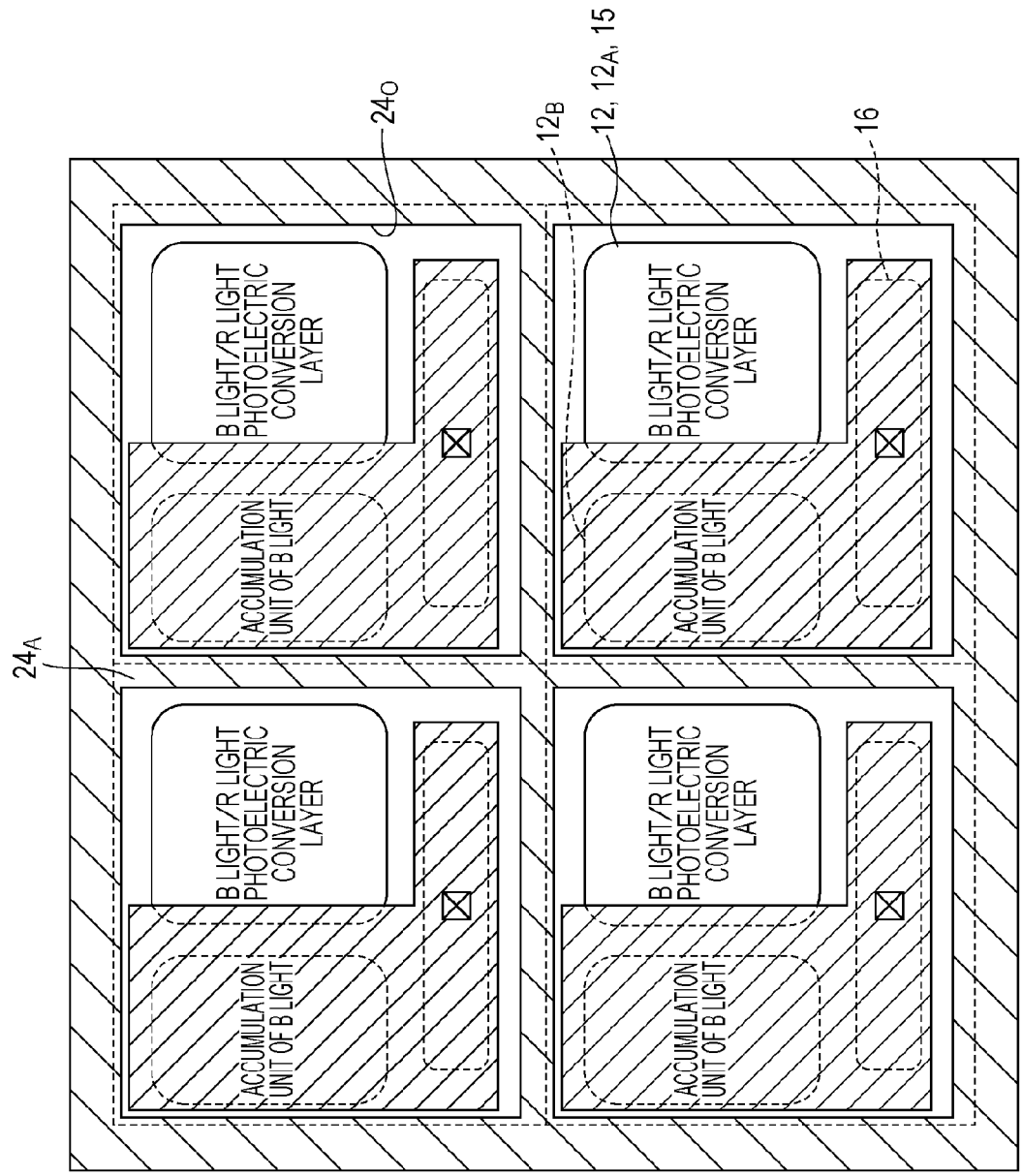
FIG. 16 is an enlarged view of four pixels in FIG. 15 which are adjacent to each other vertically, and horizontally.

FIG. 15 is a top view in a state where the light shielding film 24 of a pixel array unit in the pixel structure according to the third example of the solid-state imaging device according to the embodiment of the present disclosure is formed. FIG. 16 enlarges four pixels in FIG. 15 which are adjacent to each other vertically and horizontally. In FIGS. 15 and 16, the light shielding film 24 is shown by being hatched in order to facilitate understanding.

In the pixel structure according to the second example, a light shielding film $24_B$ which shields a G light charge accumulation unit 16 as the light shielding film 24, and a light shielding film $24_C$ which shields a photoelectric conversion unit $12_B$ of the B light photoelectric conversion layer 12 are integrally formed. In addition, it has a configuration in which the light shielding film $24_A$ of a lattice shape between pixels in the pixel structure in the first example is omitted.

In contrast to this, similarly to a case of the pixel structure in the second example, the pixel structure according to the third example has a configuration in which the light shielding film $24_B$ which shields the G light charge accumulation unit 16, and a light shielding film $24_C$ which shields the photoelectric conversion unit $12_B$ of the photoelectric conversion layer 12 are integrally formed, for example, in an L shape. An opening $24_o$ which passes input light is formed at the upper portion of the photoelectric conversion unit $12_A$ of the B light photoelectric conversion layer 12, in the light shielding films 24 ($24_B$ and $24_C$).

In addition, in the pixel structure according to the third example, as shown in FIGS. 15 and 16, it has a configuration in which the light shielding film $24_A$ which is formed in the lattice shape between pixels, and shields between pixels is provided, similarly to a case of the pixel structure in the first example. The light shielding film $24_A$ is set to a well potential, for example, a ground potential (0 V) by being in contact with the silicon substrate 11 through the contact unit 33 in the peripheral portion of the pixel array unit. That is, the light shielding film $24_A$ becomes equipotential in the entire region of the pixel array unit.

Figure 17:
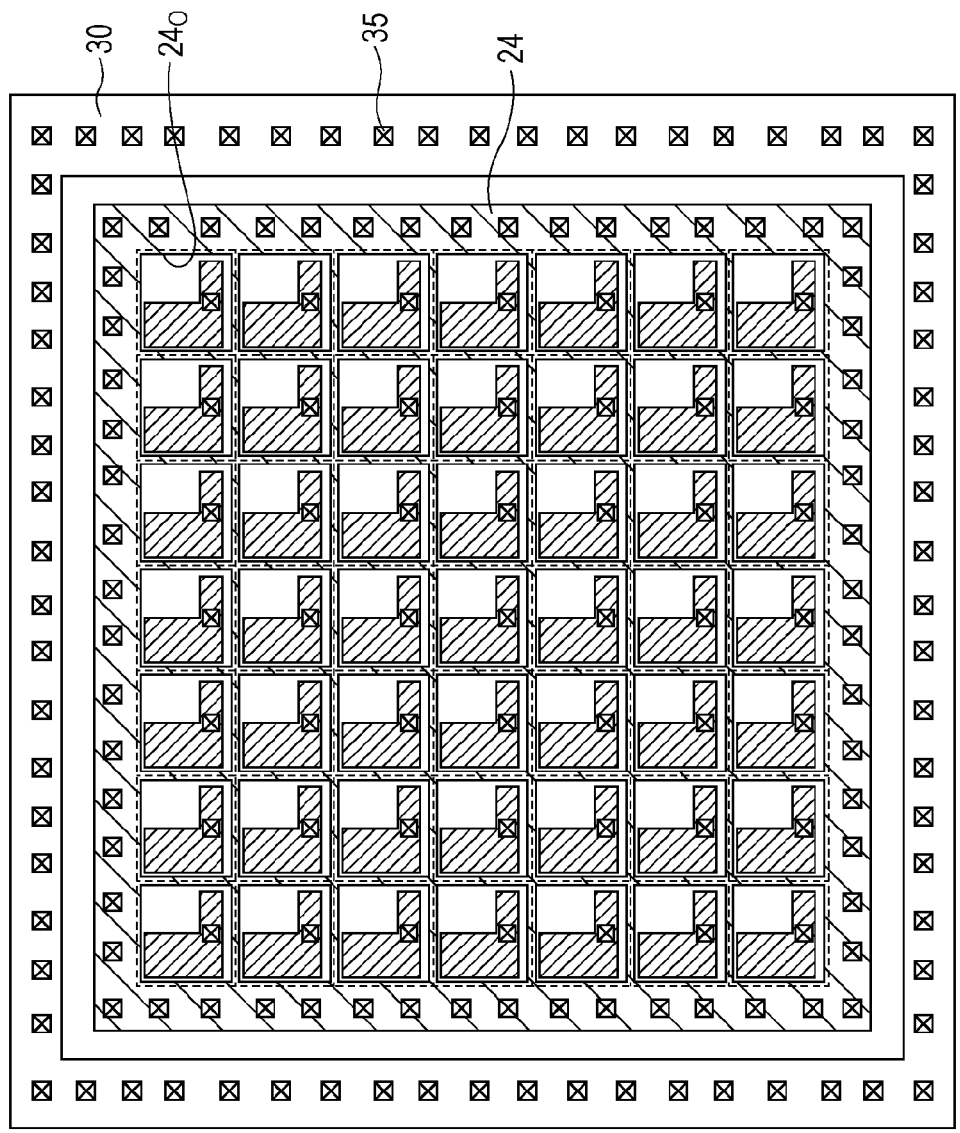
FIG. 17 is a plan view which shows a state where transparent electrodes are added in a laminating manner on upper electrodes in the pixel structure according to the third example.

FIG. 17 shows a state where a transparent electrode 30 is added to an upper electrode 29 by being laminated. As shown in the figure, the transparent electrode 30 which is added to the upper electrode 29 by being laminated is electrically connected to the silicon substrate 11 in the contact unit 35 at the peripheral portion of the pixel array unit, in order to have the same potential in the entire pixel with respect to the upper electrode 29.

1-4. Fourth Example

Figure 18:
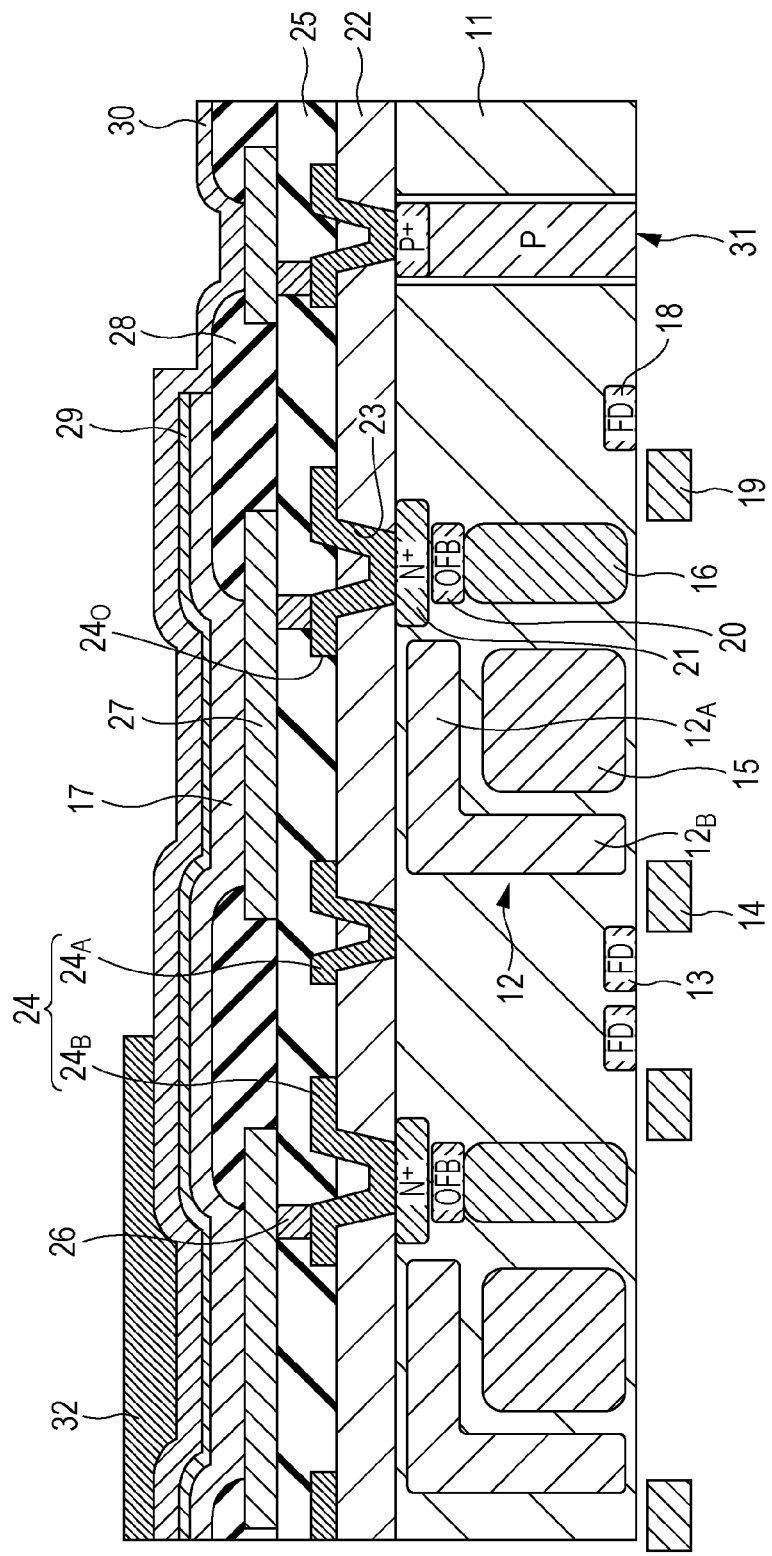
FIG. 18 is a cross-sectional view which shows a pixel structure according to a fourth example.

FIG. 18 is a cross-sectional view which shows a pixel structure according to a fourth example of the solid-state imaging device in the embodiment of the present disclosure, and the same portions in the figure as those in FIG. 1 are provided with the same reference numerals.

In the pixel structure according to the fourth example, the structure and the flow of processing is basically the same as that in the pixel structure according to the first example, however, a configuration of an $N^+$ contact unit 21 and a light shielding film 24 are different from the pixel structure according to the first example. That is, in the cross-section structure of the pixel structure according to the fourth example, the structure is basically the same as the pixel structure according to the first example shown in FIG. 1, excluding the configuration of the N+ contact unit 21, and the light shielding film 24.

In the pixel structure according to the first example, the N+ contact unit 21 is formed in an area with approximately the same size as that of the G light charge accumulation unit 16 when planarly viewed (when viewed from a light input surface), and a contact hole 23 is formed in a hole diameter corresponding to the size of the contact unit 21. Due to this, the area of the bottom portion of the contact hole 23 of the light shielding unit 24 is considerably small compared to the area of the upper portion of the G light charge accumulation unit 16.

In contrast to this, the pixel structure according to the fourth example forms the N+ contact unit 21 in an area which is larger than that of the G light charge accumulation unit 16 when planarly viewed (when viewed from a light input surface), and has a structure in which the contact hole 23 is formed with a hole diameter larger in size than the region of the charge accumulation unit 16 to the extent that it does not protrude from the region of the contact unit 21. In addition, it is possible to form the light shielding film 24 (24$_A$ and 24$_B$) which also functions as the wiring, by embedding a conductive material in the contact hole 23.

As described in the first example, as well, the light shielding film 24$_A$ is a light shielding film which shields between pixels by being formed in a lattice shape between the pixels. In addition, the light shielding film 24$_B$ is a light shielding film which shields the G light charge accumulation unit 16 of each pixel which is formed in an island shape in the pixels.

In the pixel structure according to the fourth example, the bottom portion of the contact hole 23 of the light shielding unit 24 has a large area compared to a case of the pixel structure according to the first example, and not only performs an electrical connection to the N+ contact unit 21, but also functions as the light shielding film. In this manner, it is possible to effectively prevent oblique input light from leaking into the G light charge accumulation unit 16, since the distance between the G light charge accumulation unit 16 and the light shielding film 24 (that is, the bottom portion of the contact hole 23 of the light shielding unit 24).

In addition, in the pixel structure according to the fourth example, it can be also mentioned as one of characteristics that the contact hole 23 is formed with a hole diameter smaller than the region of the N+ contact unit 21. When the contact hole 23 is formed so as to protrude from the region of the N+ contact unit 21, the leakage is increased through contact metal between the N+ contact unit 21 and P well (substrate) at the periphery of the N+ contact unit 21. Accordingly, it is important to make the region of the contact hole 23 smaller than that of the N+ contact unit 21.

In addition, a structure in which the region of the contact hole 23 is formed to be smaller than that of the N+ contact unit 21, and further the G light charge accumulation unit 16 is shielded at the bottom portion of the contact hole 23 of the light shielding unit 24 is a structure which can be realized only by the pixel structure according to the fourth example (first example). Specifically, it is an advantageous structure which is possible only because the G light charge accumulation unit 16, the overflow barrier 20, and the N+ contact unit 21 are laminated in the vertical direction (direction perpendicular to the substrate surface).

In other words, the pixel structure according to the fourth example is not realized in a structure in which the overflow barrier 20 is formed next to the N+ contact unit 21, and the G light charge accumulation unit 16 is formed in the horizontal direction (direction parallel to the substrate surface).

2. Modification Example

In the above described embodiment, a pixel structure was described as an example in which the photoelectric conversion film which is provided outside the substrate is set to the G light photoelectric conversion film, and the photoelectric conversion layer which is provided inside the substrate is set to the photoelectric conversion layers of B light and R light, however, this combination is only an example, and is not limited thereto.

That is, the photoelectric conversion film which is provided outside the substrate may be a film which performs the photoelectric conversion with respect to light in a predetermined wavelength region, and transmits light in other wavelength regions. In addition, the photoelectric conversion layer which is provided inside the substrate may be a layer which performs the photoelectric conversion with respect to light in other wavelength regions.

In addition, in the above embodiment, a pixel structure was described as an example, in which photoelectric conversion layer which is provided in the substrate is set to two colors of photoelectric conversion layers of B light and R light, however, the structure is not limited thereto, and it is possible to apply the technology of the present disclosure, when it is a pixel structure in which at least one color of photoelectric conversion layer is provided in the substrate.

In addition, the technology of the present disclosure is not only applied to a solid-state imaging device which detects the distribution of the light intensity of input visible light, and performs imaging as an image, but is also applicable to all solid-state imaging devices which image the distribution of the input amount of infrared light, X-rays, or particles or the like as an image.

In addition, the solid-state imaging device may be formed as one chip, or may be a modular form with an imaging function in which an imaging unit and a signal processing unit, or an optical system are integrally packaged.

3. Electronic Apparatus

The present disclosure is applied not only to the solid-state imaging device, but also to all electronic apparatuses in which the solid-state imaging device is used in the imaging unit (photoelectric conversion unit) such as an imaging device like a digital still camera, a video camera, or the like, and a mobile terminal device having an imaging function such as a mobile phone. In the electronic apparatus in which the solid-state imaging device is used in the imaging unit, a copy machine which uses the solid-state imaging device in the image reading unit is also included. In addition, there is a case where the modular form which is installed to the electronic apparatus, that is, the camera module is used as the imaging device.

Imaging Device

Figure 19:
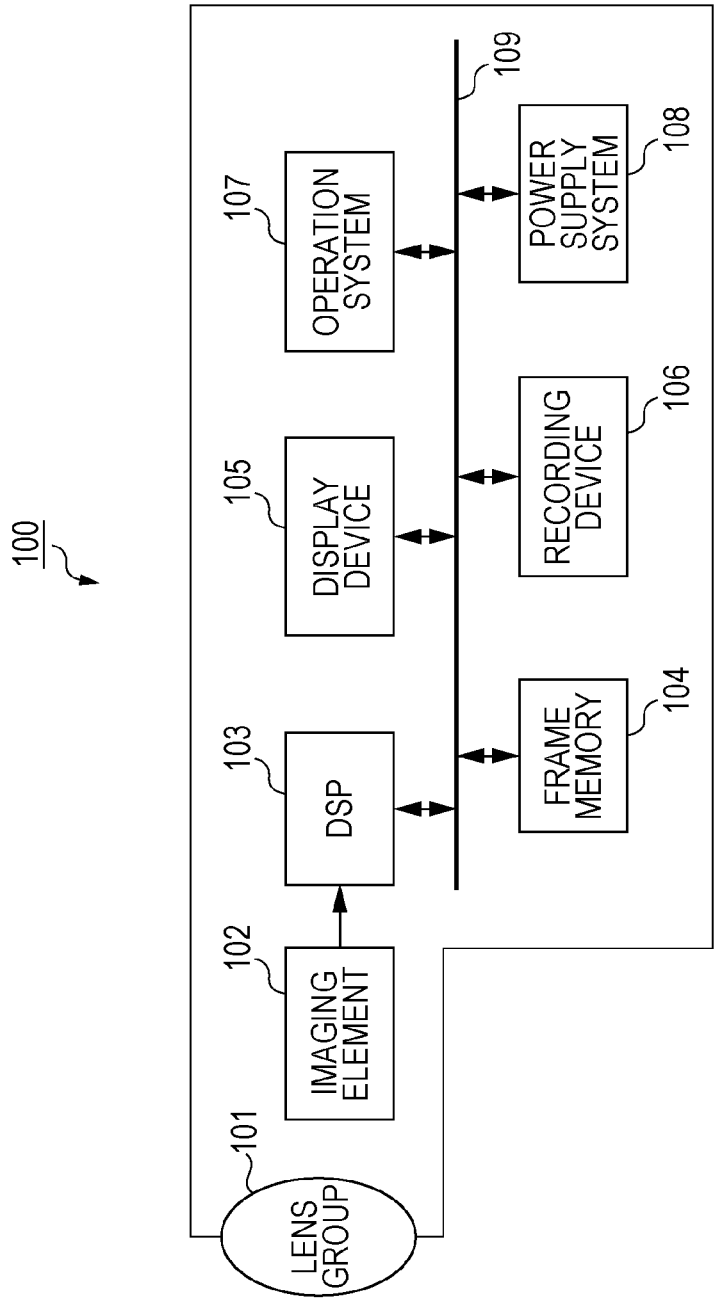
FIG. 19 is a block diagram which shows an example of a configuration of the electronic apparatus according to the present disclosure, for example, an imaging device.

FIG. 19 is a block diagram which shows an example of a configuration of the electronic apparatus according to the present disclosure, for example, the imaging device.

As shown in FIG. 19, the imaging device 100 according to the present disclosure includes an optical system including such as a lens group 101 or the like, an imaging element (imaging device 102), a DSP circuit 103, a frame memory 104, a display device 105, a recording device 106, an operation system 107, a power supply system 108, or the like. In addition, the DSP circuit 103, the frame memory 104, the display device 105, the recording device 106, the operation system 107, and the power supply system 108 are connected to each other through a bus line 109.

The lens group 101 takes in input light (image light) from an object, and forms as an image on the imaging surface of the imaging element 102. The imaging element 102 converts the intensity of the input light which is imaged on the imaging surface by the lens group 101, and outputs as pixel signals.

The display device 105 is formed of a panel-type display device such as a liquid display device, or an organic EL (electro luminescence) display device or the like, and displays a moving image, or a still image which is incident the imaging element 102. The recording device 106 records a moving image or a still image which is incident the imaging element 102 on a recording medium such as a video tape, a DVD (Digital Versatile Disc), or the like.

The operation system 107 issues an operating instruction with respect to a variety of functions which is included in the imaging device under the operation by a user. The power supply system 108 appropriately supplies various types of power supply as an operation power source of the DSP circuit 103, the frame memory 104, the display device 105, the recording device 106, and the operation system 107 to these supply targets.

The imaging device with the configuration is able to be used as a video camera, or a video still camera, and further, as a variety of imaging devices such as a camera module for mobile devices such as a mobile phone. In addition, in the imaging device, it is possible to obtain the following operation and effect, by using the solid-state imaging device according to the above described embodiments as the imaging unit, that is, as the imaging element 102.

That is, the solid-state imaging device according to the above described embodiments is able to reduce the F value dependency of the sensitivity of each color, since it is possible to make the change in sensitivity with respect to the F value which is caused by the difference in arranging position of the photoelectric conversion film and the photoelectric conversion layer, in the optical axis direction of the input light. Accordingly, it is possible to obtain a good captured image by using the solid-state imaging device as the imaging unit in the variety of imaging devices.

4. Configuration of the Present Disclosure (1) A solid-state imaging device which includes, a photoelectric conversion film provided on a second surface side which is the opposite side to a first surface on which a wiring layer of a semiconductor substrate is formed, performs photoelectric conversion with respect to light in a predetermined wavelength region, and transmits light in other wavelength regions; and a photoelectric conversion layer which is provided in the semiconductor substrate, and performs the photoelectric conversion with respect to light in other wavelength regions which has transmitted the photoelectric conversion film, in which input light is incident from the second surface side with respect to the photoelectric conversion film and the photoelectric conversion layer.

(2) The solid-state imaging device described in (1) includes a light shielding film which defines a region in which light is input to the semiconductor substrate, in which the light shielding film is electrically connected to the semiconductor substrate.

(3) The solid-state imaging device described in (2), in which the light shielding film is provided with an opening which passes input light to the semiconductor substrate side, and the photoelectric conversion film has an area which is larger than that of the opening.

(4) The solid-state imaging device described in any one of (2) or (3), further includes a charge accumulation unit which is provided in the semiconductor substrate, and accumulates a charge which is photoelectrically converted in the photoelectric conversion film, in which the light shielding film is electrically connected to the semiconductor substrate for each pixel, and transfers the charge which is photoelectrically converted in the photoelectric conversion film to the charge accumulation unit.

(5) The solid-state imaging device described in (4), in which the light shielding film has an area which is larger than that of an upper portion of the charge accumulation unit, and performs light shielding with respect to the charge accumulation unit.

(6) The solid-state imaging device described in (5), in which the light shielding film includes a convex portion which protrudes from a portion which has a larger area than that of the charge accumulation unit, and a portion of the large area to the semiconductor substrate side, and comes into electrical contact with a diffused region which is formed on a front layer portion of the semiconductor substrate, in which light shielding is performed with respect to the charge accumulation unit even by the convex portion.

(7) The solid-state imaging device described in (5), in which the light shielding film comes into electrical contact with the diffused region which is formed on the front layer portion of the semiconductor substrate, and the diffused region has a large area than that of the upper portion of the charge accumulation unit.

(8) The solid-state imaging device described in any of (2) to (7), in which the light shielding film has a light shielding region which performs the light shielding between pixels, and the light shielding region is applied with a predetermined potential from the semiconductor substrate side through the light shielding film.

(9) The solid-state imaging device described in any of (2) to (7), in which the photoelectric conversion film is pinched by a lower electrode and an upper electrode, and a part of the light shielding film is used as a wiring which supplies a predetermined bias voltage to the upper electrode from the semiconductor substrate side.

(10) An electronic apparatus which includes a solid-state imaging device including, a photoelectric conversion film provided on a second surface side which is the opposite side to a first surface on which a wiring layer of a semiconductor substrate is formed, performs photoelectric conversion with respect to light in a predetermined wavelength region, and transmits light in other wavelength regions; and a photoelectric conversion layer which is provided in the semiconductor substrate, and performs the photoelectric conversion with respect to light in other wavelength regions which has transmitted the photoelectric conversion film, and in which input light is incident from the second surface side with respect to the photoelectric conversion film and the photoelectric conversion layer.

The present disclosure contains subject matter related to that disclosed in Japanese Priority Patent Application JP 2011-105284 filed in the Japan Patent Office on May 10, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a photoelectric conversion film provided at a second surface side of a semiconductor substrate, the second surface side of the semiconductor substrate located opposite to a first surface side of the semiconductor substrate at which a wiring layer of the semiconductor substrate is formed, wherein the photoelectric conversion film performs photoelectric conversion with respect to light of a predetermined wavelength region and transmits light of other wavelength regions;
a photoelectric conversion layer provided within the semiconductor substrate, wherein the photoelectric conversion layer includes a photoelectric conversion unit that performs photoelectric conversion with respect to the light of the other wavelength regions and the photoelectric conversion layer includes a photoelectric charge accumulation unit; and
a charge accumulation unit provided within the semiconductor substrate, wherein the charge accumulation unit provided within the semiconductor substrate is separate from the charge accumulation unit of the photoelectric conversion layer and accumulates charge from the photoelectric conversion film.

2. The solid-state imaging device according to claim 1, further including:
a light shielding film which defines a region in which light enters the semiconductor substrate,
wherein the light shielding film is electrically connected to the semiconductor substrate.

3. The solid-state imaging device according to claim 2, wherein the light shielding film is provided with an opening which passes light to the semiconductor substrate side, and
wherein the photoelectric conversion film has an area which is larger than that of the opening.

4. The solid-state imaging device according to claim 2, wherein the light shielding film is electrically connected to the semiconductor substrate for each pixel, and the light shielding film transfers the charge which is photoelectrically converted in the photoelectric conversion film to the charge accumulation unit.

5. The solid-state imaging device according to claim 4, wherein the light shielding film has an area which is larger than that of an upper portion of the charge accumulation unit, and the light shielding film performs light shielding with respect to the charge accumulation unit.

6. The solid-state imaging device according to claim 5, wherein the light shielding film includes:
a portion having a larger area than that of the upper portion of the charge accumulation unit, and
a convex portion which protrudes from the portion of the larger area to the semiconductor substrate side, wherein the convex portion is in electrical contact with a diffused region formed on a front layer portion of the semiconductor substrate in which light shielding is performed with respect to the charge accumulation unit by the convex portion.

7. The solid-state imaging device according to claim 5, wherein the light shielding film is in electrical contact with a diffused region is formed on a front layer portion of the semiconductor substrate, and
wherein the diffused region has a larger area than that of the upper portion of the charge accumulation unit.

8. The solid-state imaging device according to claim 2, wherein the light shielding film includes a light shielding region which performs light shielding between pixels, and a predetermined potential is applied to the light shielding region.

9. The solid-state imaging device according to claim 2, wherein the photoelectric conversion film is pinched by a lower electrode and an upper electrode, and
wherein a part of the light shielding film is used as a wiring which supplies a predetermined bias voltage to the upper electrode from the semiconductor substrate side.

10. An electronic apparatus comprising:
a solid-state imaging device which includes:
a photoelectric conversion film provided at a second surface side of a semiconductor substrate, the second surface side of the semiconductor substrate located opposite to a first surface side of the semiconductor substrate at which a wiring layer of the semiconductor substrate is formed, wherein the photoelectric conversion film performs photoelectric conversion with respect to light of a predetermined wavelength region and transmits light of other wavelength regions;
a photoelectric conversion layer provided within the semiconductor substrate, wherein the photoelectric conversion layer includes a photoelectric conversion unit that performs photoelectric conversion with respect to the light of the other wavelength regions and the photoelectric conversion layer includes a photoelectric charge accumulation unit; and
a charge accumulation unit provided within the semiconductor substrate, wherein the charge accumulation unit provided within the semiconductor substrate is separate from the charge accumulation unit of the photoelectric conversion layer and accumulates charge from the photoelectric conversion film.

11. The electronic apparatus according to claim 10, further including:
a light shielding film which defines a region in which light enters the semiconductor substrate,
wherein the light shielding film is electrically connected to the semiconductor substrate.

12. The electronic apparatus according to claim 11, wherein the light shielding film is provided with an opening which passes light to the semiconductor substrate side, and
wherein the photoelectric conversion film has an area which is larger than that of the opening.

13. The electronic apparatus according to claim 11, wherein the light shielding film is electrically connected to the semiconductor substrate for each pixel, and the light shielding film transfers the charge which is photoelectrically converted in the photoelectric conversion film to the charge accumulation unit.

14. The electronic apparatus according to claim 13, wherein the light shielding film has an area which is larger than that of an upper portion of the charge accumulation unit, and the light shielding film performs light shielding with respect to the charge accumulation unit.

15. The electronic apparatus according to claim 14, wherein the light shielding film includes:
a portion having a larger area than that of the upper portion of the charge accumulation unit; and
a convex portion which protrudes from the portion of the larger area to the semiconductor substrate side, wherein the convex portion is electrically connected to a diffused region formed on a front layer portion of the semiconductor substrate in which light shielding is performed with respect to the charge accumulation unit by the convex portion.

16. The electronic apparatus according to claim 14, wherein the light shielding film is electrically connected to a diffused region and is formed on a front layer portion of the semiconductor substrate, and wherein the diffused region has a larger area than that of the upper portion of the charge accumulation unit.

17. The electronic apparatus according to claim 11, wherein the light shielding film includes a light shielding region which performs light shielding between pixels, and a predetermined potential is applied to the light shielding region.

18. The electronic apparatus according to claim 11, wherein the photoelectric conversion film is pinched by a lower electrode and an upper electrode, and wherein a part of the light shielding film is used as a wiring which supplies a predetermined bias voltage to the upper electrode from the semiconductor substrate side.

19. The solid-state imaging device according to claim 2, further including a first transfer gate that is configured to transfer charge from the photoelectric conversion film accumulated in the charge accumulation unit to a floating diffusion region.

20. The solid-state imaging device according to claim 2, further including a second photoelectric conversion layer provided between the photoelectric conversion layer that performs photoelectric conversion with respect to the light of the other wavelength regions and the second surface side of the semiconductor substrate, wherein the second photoelectric conversion layer performs photoelectric conversion with respect to light of the other wavelength regions that passes through the photoelectric conversion layer, wherein the second photoelectric conversion layer and the photoelectric conversion layer that performs photoelectric conversion with respect to the light of the other wavelength regions are vertically provided along an optical axis of input light.

* * * * *